United States Patent
Tsurume et al.

(10) Patent No.: US 8,058,152 B2
(45) Date of Patent: Nov. 15, 2011

(54) METHOD FOR MANUFACTURING INTEGRATED CIRCUIT

(75) Inventors: Takuya Tsurume, Atsugi (JP); Junya Maruyama, Ebina (JP); Yoshitaka Dozen, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/859,878

(22) Filed: Aug. 20, 2010

(65) Prior Publication Data

US 2010/0317156 A1    Dec. 16, 2010

Related U.S. Application Data

(62) Division of application No. 10/591,700, filed as application No. PCT/JP2005/005064 on Mar. 15, 2005, now Pat. No. 7,820,529.

(30) Foreign Application Priority Data

Mar. 22, 2004    (JP) ................. 2004-083664

(51) Int. Cl.
*H01L 21/00* (2006.01)

(52) U.S. Cl. ............... 438/464; 438/458; 257/E21.599; 257/E21.601

(58) Field of Classification Search .............. 438/464, 438/460, 458, 113; 257/E21.599, E21.601
See application file for complete search history.

(56) References Cited

U.S. PATENT DOCUMENTS

| | | | |
|---|---|---|---|
| 5,206,749 A | 4/1993 | Zavracky et al. | |
| 5,757,456 A | 5/1998 | Yamazaki et al. | |
| 5,834,327 A | 11/1998 | Yamazaki et al. | |
| 6,127,199 A | 10/2000 | Inoue et al. | |
| 6,468,638 B2 | 10/2002 | Jacobsen et al. | |
| 6,521,511 B1 | 2/2003 | Inoue et al. | |
| 6,627,518 B1 | 9/2003 | Inoue et al. | |
| 6,700,631 B1 | 3/2004 | Inoue et al. | |
| 6,814,832 B2 | 11/2004 | Utsunomiya | |
| 6,849,877 B2 | 2/2005 | Yamazaki et al. | |
| 6,858,518 B2 | 2/2005 | Kondo | |
| 6,873,033 B2 | 3/2005 | Kawai et al. | |

(Continued)

FOREIGN PATENT DOCUMENTS

CN    1397984    2/2003

(Continued)

OTHER PUBLICATIONS

International Search Report (Application No. PCT/JP2005/005064) dated Jun. 14, 2005.

(Continued)

*Primary Examiner* — David Zarneke

(74) *Attorney, Agent, or Firm* — Eric J. Robinson; Robinson Intellectual Property Law Office, P.C.

(57) ABSTRACT

A method for separating an integrated circuit formed by a thin film having a novel structure or a method for transferring the integrated circuit to another substrate, that is, so-called transposing method, has not been proposed. According to the present invention, in the case that an integrated circuit having a thin film having a novel structure formed over a substrate via a release layer is separated, the release layer is removed in the state that the thin film integrated circuit is fixated, the thin film integrated circuit is transposed to a supporting substrate having an adhesion surface, and the thin film integrated circuit is transposed to another substrate having an adhesion surface with higher strength of adhesion than that of the supporting substrate.

22 Claims, 23 Drawing Sheets

U.S. PATENT DOCUMENTS

| | | |
|---|---|---|
| 6,887,650 B2 | 5/2005 | Shimoda et al. |
| 7,045,438 B2 | 5/2006 | Yamazaki et al. |
| 7,060,153 B2 | 6/2006 | Yamazaki et al. |
| 7,070,851 B2 | 7/2006 | Jacobsen et al. |
| 7,091,070 B2 | 8/2006 | Imai et al. |
| 7,122,445 B2 | 10/2006 | Takayama et al. |
| 7,211,828 B2 | 5/2007 | Yamazaki et al. |
| 7,244,662 B2 | 7/2007 | Kondo |
| 7,271,076 B2 | 9/2007 | Yamazaki et al. |
| 7,288,432 B2 | 10/2007 | Jacobsen et al. |
| 7,420,208 B2 | 9/2008 | Yamazaki et al. |
| 7,452,786 B2 | 11/2008 | Dozen et al. |
| 7,465,647 B2 | 12/2008 | Yamazaki et al. |
| 7,476,575 B2 | 1/2009 | Tsurume et al. |
| 7,534,702 B2 | 5/2009 | Arao et al. |
| 7,566,640 B2 | 7/2009 | Yamazaki et al. |
| 7,632,721 B2 | 12/2009 | Yamazaki et al. |
| 7,728,326 B2 | 6/2010 | Yamazaki et al. |
| 7,862,677 B2 | 1/2011 | Nakajima et al. |
| 7,952,101 B2 | 5/2011 | Yamazaki et al. |
| 2003/0032210 A1 | 2/2003 | Takayama et al. |
| 2003/0170946 A1 | 9/2003 | Kondo |
| 2005/0106839 A1 | 5/2005 | Shimoda et al. |
| 2008/0044940 A1 | 2/2008 | Watanabe et al. |
| 2010/0163859 A1 | 7/2010 | Yamazaki et al. |

FOREIGN PATENT DOCUMENTS

| | | |
|---|---|---|
| EP | 1 326 289 | 7/2003 |
| EP | 1455394 | 9/2004 |
| JP | 07-030209 | 1/1995 |
| JP | 2000-020665 A | 1/2000 |
| JP | 2000-150379 | 5/2000 |
| JP | 2001-272923 A | 10/2001 |
| JP | 2003-100450 A | 4/2003 |
| JP | 2003/203898 | 7/2003 |
| JP | 2003-204047 A | 7/2003 |
| JP | 2003-209073 | 7/2003 |
| WO | WO 00/55915 | 9/2000 |
| WO | WO-03/010825 | 2/2003 |

OTHER PUBLICATIONS

Written Opinion (Application No. PCT/JP2005/005064) dated Jun. 14, 2005.

Office Action (Application No. 200580009341.4) dated Jun. 6, 2008.

Korean Office Action (Application No. 2006-7021526) Dated Jun. 24, 2011.

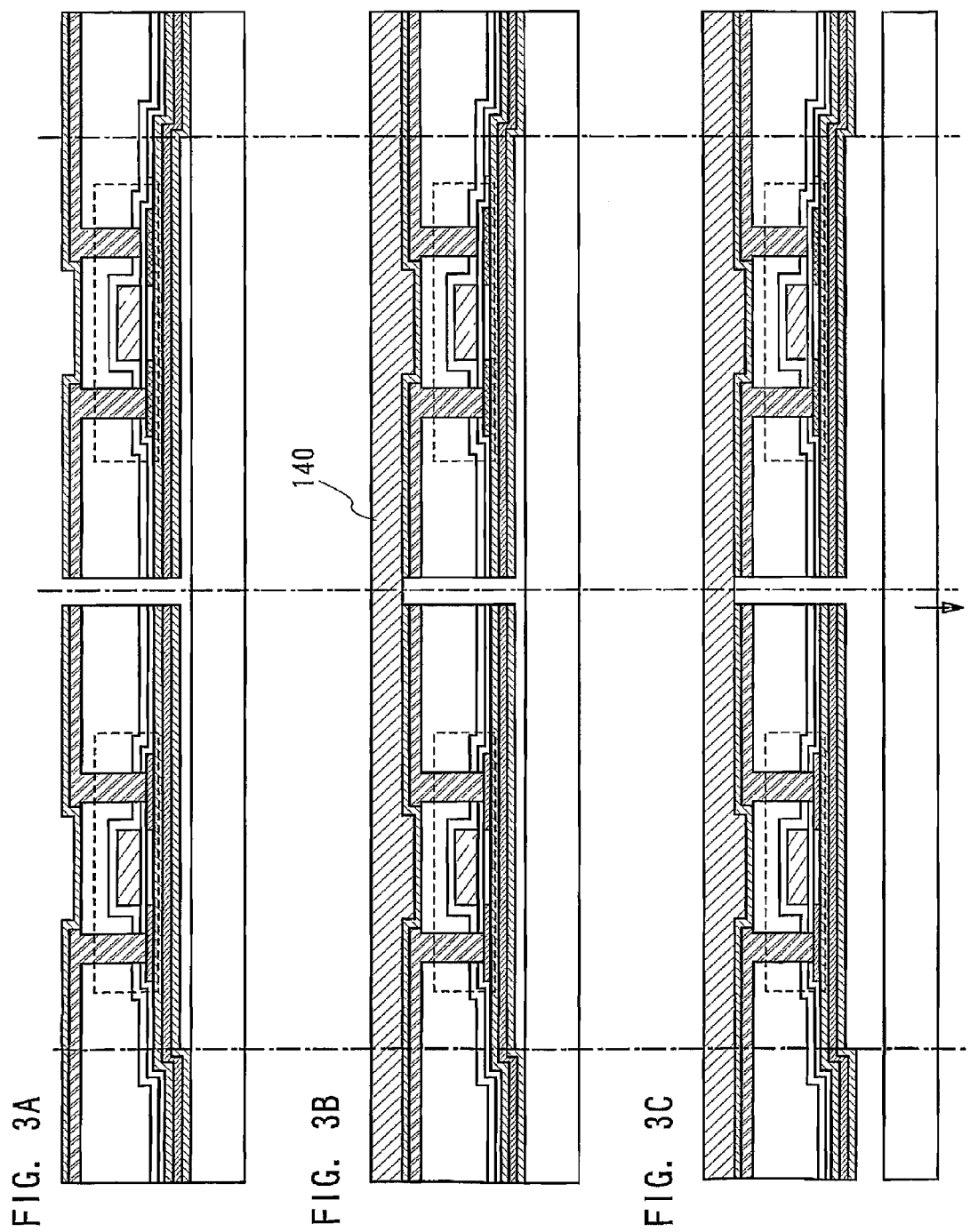

a  b c  d

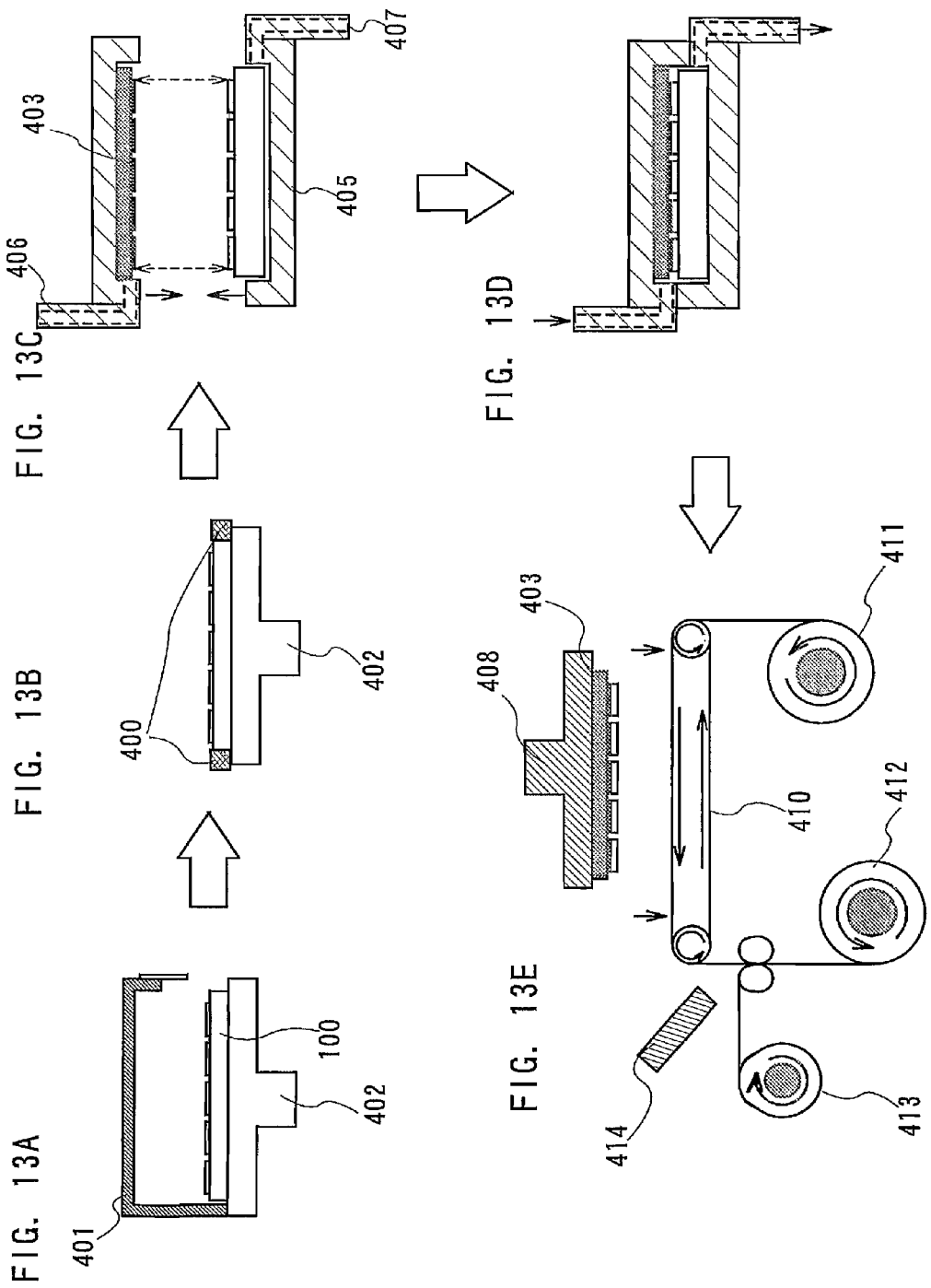

METHOD FOR MANUFACTURING INTEGRATED CIRCUIT

TECHNICAL FIELD

The present invention relates to a method for separating an integrated circuit or the like formed by a thin film and a method for manufacturing the integrated circuit.

BACKGROUND ART

A method for separating an integrated circuit using the conventional silicon wafer (hereinafter, IC chip) from a substrate has been proposed (Unexamined Patent Publication No. 2003-209073). The Unexamined Patent Publication No. 2003-209073 disclosed that a protective tape is adhered to a circuit surface of a semiconductor wafer, a dicing tape is adhered to a reverse surface, and the semiconductor wafer is diced with the protective tape to form a chip, then, a release tape is adhered to the diced protective tape, and then, the protective tape is heated to be deformed, lastly, the protective tape that is diced with the release tape is separated from the chip.

As a method for mounting an optical device chip on an electronic circuit board, a method for making a crystal growth of a buffer layer and an active layer over a semiconductor device, forming a plurality of optical devices, forming a separation groove by etching the active layer till the active layer reaches to the buffer layer, removing the semiconductor substrate by covering the surface of the active layer by the protective film, adhering the reverse side of the buffer layer to an extensible film with adhesive capable of being separated, breaking the buffer layer along with the separation groove, providing a space between adjacent devices by extending the extensible film, and fusion bonding and fixating a driver electrode of the optical device to the electronic circuit board by using the extensible film as a support jig (Unexamined Patent Publication No. 7-30209).

DISCLOSURE OF INVENTION

As noted above, a method for separating the conventional IC chip from a substrate has been proposed; however, a method for separating an integrated circuit formed by a thin film according to the present invention and transferring the integrated circuit to another substratum, that is, so-called transposing method, has not been proposed. The handling of the integrated circuit formed by the thin film according to the present invention has been difficult since there is fear that the integrated circuit is flied during moving due to its extreme light weight.

In view of the foregoing, it is an object of the present invention to provide a method for transposing an integrated circuit formed by a thin film according to the present invention and a method for manufacturing the integrated circuit using the method for transposing the integrated circuit.

According to the present invention, in the case that an integrated circuit having a thin film having a novel structure formed over an insulating substrate via a release layer (hereinafter, thin film integrated circuit) is separated, the release layer is removed in the state that the thin film integrated circuit is fixated, the thin film integrated circuit is transposed to a supporting substratum having an adhesion surface (first substratum), and the thin film integrated circuit is transposed to another substratum (second substratum) having an adhesion surface with higher strength of adhesion (adhesion strength) than that of the first substratum. That is, the thin film integrated circuit is transposed to another substratum having an adhesion surface with higher adhesion strength than that of the supporting substrate. Further, a chip having the thin film integrated circuit is referred to as an IDF chip.

According to the present invention, the present invention has a means of making the thin film integrated circuit be fixated (a means for fixating a thin film integrated circuit). According to the present invention, a region that is not provided with the release layer is provided as a specific means for fixating a thin film integrated circuit (That is, the release layer is partially provided for fixating a thin film integrated circuit.). As a result, the thin film integrated circuit is integrated with the substrate, and so the thin film integrated circuit does not fly when the thin film integrated circuit moves or the pressure in a reaction chamber is controlled. Thereafter, the thin film integrated circuit is transposed to the supporting substratum having an adhesion surface, and the thin film integrated circuit is transposed to another substratum. In this instance, the adhesion strength of the supporting substratum is lower than that of another substratum. As a result, the thin film integrated circuit can be transposed to another substratum at once, and so mass productivity can be improved. During the process, the thin film integrated circuit does not fly in all directions since it is fixated.

According to the present invention, a means for pressing the integrated circuit is used as another means for fixating a thin film integrated circuit. As the means for pressing, a supporting substratum having an adhesion surface can be used. For instance, a substrate having an adhesion force such as silicon rubber can be used. Then, the release layer is removed in the state that the thin film integrated circuit is pressed by the means for pressing. As a result, the thin film integrated circuit does not fly when the thin film integrated circuit moves or the pressure in a reaction chamber is controlled since it can remain the state of being integrated with the substrate. Thereafter, the thin film integrated circuit is transposed. In this instance, the adhesion strength of the supporting substratum is lower than that of another substratum. That is, the thin film integrated circuit is transposed to another substratum having higher adhesion strength than that of the supporting substratum. As a result, the thin film integrated circuit can be transposed to another substratum at once, and so mass productivity can be improved. During the process, the thin film integrated circuit does not fly since it is fixated.

Another substratum may be a substrate made from a thin film such as a flexible substrate or a protective film. Alternatively, another substratum may be a substrate provided with an antenna as a communication means or a power supply means.

According to the present invention, a multiple thin film integrated circuits can be transposed to another substratum at once without flying the thin film integrated circuits when the thin film integrated circuit moves or the pressure in a reaction chamber is controlled. As a result, mass productivity can be improved.

Since the IDF chip according to the present invention is extremely thinner than that of an IC chip formed by a silicon wafer, the IDF chip does not detract from the design of a good when it is mounted to the good. Such the thin and lightweight IDF chip having a high flexible property is hardly broken, which is different from the IC chip formed by a silicon wafer.

Since the IDF chip according to the present invention is formed over an insulating substrate, there is no limitation on a mother substrate shape, which is also different from the IC chip formed by a silicon wafer. Therefore, mass productivity can be improved and the IDF chip can be mass-produced. As a result, the cost of the IDF chip can be expected to be reduced. The unit price of the IDF chip is so low. Accordingly, reducing the unit price of the IDF chip can yield an extremely large profit.

BRIEF DESCRIPTION OF DRAWINGS

FIGS. 3A to 3C are views of illustrating a manufacturing process of a thin film integrated circuit;

FIGS. 13A to 13E are views of illustrating a manufacturing process of a thin film integrated circuit;

BEST MODE FOR CARRYING OUT THE INVENTION

The above and further objects and novel features of the invention will more fully appear from the following details description when the same is read in connection with the accompanying drawings. It is to be understood that various changes and modifications will be apparent to those skilled in the art. Therefore, unless otherwise such changes and modifications depart from the scope of the present invention hereinafter described, they should be construed as being included therein. Through the drawings of the embodiments, like components are denoted by like numerals and will not be further explained.

Embodiment 1

In this embodiment, a method for manufacturing a thin film integrated circuit provided with a region that does not form a release layer as a means for fixating the thin film integrated circuit is explained.

Figure 1A:
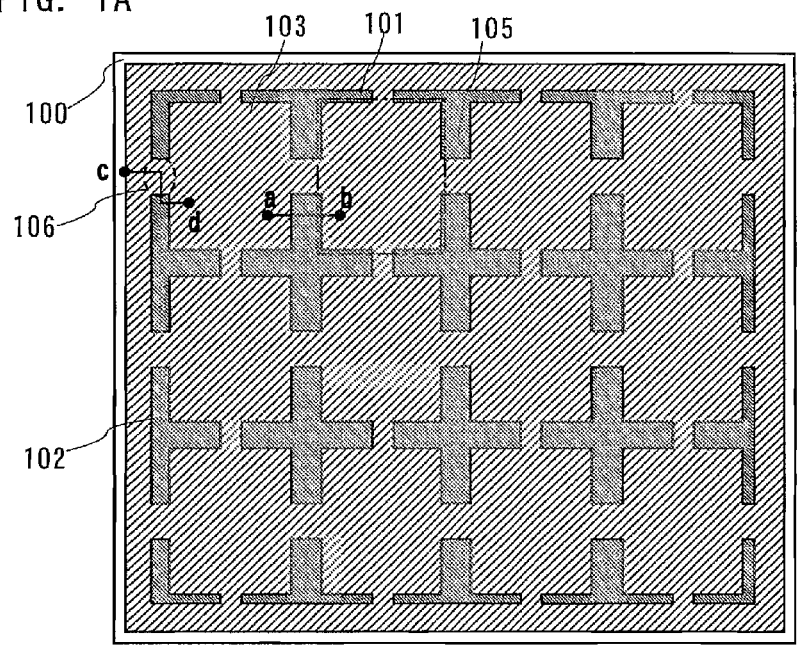
FIGS. 1A to 1C are views of illustrating a manufacturing process of a thin film integrated circuit.
Figure 1B:
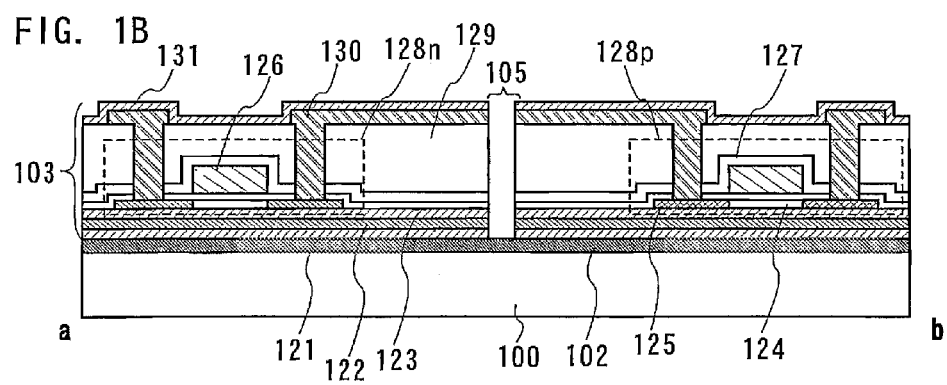
Figure 1C:
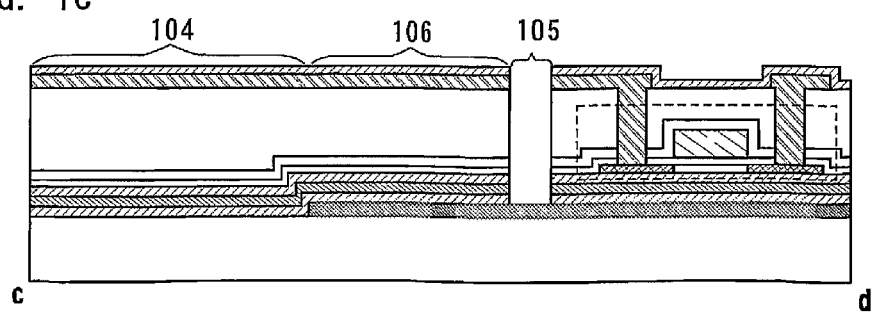

As illustrated in FIG. 1A, a release layer 102 and a layer 103 having a thin film transistor (also referred to as a TFT) that has a semiconductor film as an active region (hereinafter, TFT layer) are sequentially formed over an insulating substrate 100. A plurality of thin film integrated circuits 101 is formed. FIG. 1B illustrates a cross-sectional view of FIG. 1A taken along line a-b. FIG. 1C illustrates a cross-sectional view of FIG. 1A taken along line c-d.

As the insulating substrate 100, a glass substrate such as barium borosilicate glass or alumino-borosilicate glass, a quartz substrate, or the like can be used. As another insulating substrate, a substrate made from plastic as typified by poly ethylene terephthalate (PET), poly ethylene naphthalate (PEN), poly ether sulfone (PES); a substrate made from synthetic resin such as acrylic having flexibility; or the like can be used. Alternatively, a substrate prepared by forming an insulating film such as silicon oxide or silicon nitride over the surface of metal such as stainless or a semiconductor substrate can be used. Such the insulating substrate has no limitation on a mother substrate shape so that a thin film integrated circuit can be manufactured at low cost, which is different from the case that an IC chip is taken from a circular silicon wafer.

The release layer 102 may include silicon and has any one of a structure of an amorphous semiconductor, a semiamorphous semiconductor (also referred to as SAS) that is a mixture of an amorphous state semiconductor and a crystal state semiconductor, and a crystalline semiconductor. The SAS includes a micro crystalline semiconductor in which a crystal grain of 0.5 to 20 nm can be observed in an amorphous semiconductor. The release layer 102 can be formed by sputtering, plasma CVD, or the like. Further, the release layer 102 may be formed to have a thickness of 30 nm to 1 μm. The release layer 102 can be formed to have a thickness of 30 nm or less, only when which is acceptable for a limitation of fainting a thin film of a film formation device for the release layer 102.

An element such as phosphorous or boron can be doped to the release layer 102. Moreover, the element can be activated by application of heat or the like. By doping an element, a reaction rate, that is, an etching rate of the release layer 102 can be controlled.

In this embodiment, SAS (semi-amorphous silicon) having a thickness of 30 nm to 1 μm, preferably, 30 to 50 nm is, but not exclusively, used for the release layer 102. Other materials than the foregoing materials can be used.

For instance, a film including metal can be formed as the release layer. As the metal, a single layer or a laminated layer made from an element selected from the group consisting of W, Ti, Ta, Mo, Nd, Ni, Co, Zr, Zn, Ru, Rh, Pd, Os, and Ir; or an alloy material or a compound material containing the foregoing element as its main component can be used. As a manufacturing method for the film including metal, for example, a sputtering method using a metal target can be used. The film including metal may be formed to have a thickness of 10 to 200 nm, preferably, 50 to 75 nm. Instead of the film including a metal, a film including nitrides of the foregoing metal (for example, tungsten nitride or molybdenum nitride) may be used.

The release layer 102 is selectively formed, for example, the release layer 102 formed except over the periphery of the insulating substrate. By a region 104 that is not provided with the release layer 102, a TFT layer becomes not discrete even after removing the release layer 102. That is, the TFT layer is integrated with the insulating substrate 100. As a means for selectively forming the release layer 102; a method of forming the release layer 102 by arranging a mask to cover the periphery of the insulating substrate 100, or a method of etching the periphery of the insulating substrate 100 after forming the release layer 102 over the entire surface of the insulating substrate 100 can be used.

The TFT layer 103 includes thin film transistors 128n, 128p which have a base insulating film, a semiconductor film 124 patterned into a desired shape, and a conductive film 126 serving as a gate electrode (hereinafter, gate electrode) provided via a gate insulating film (hereafter, gate insulating film) 125. The semiconductor film 124 is formed to have a thickness of 0.2 μm or less, typically, 40 to 170 nm, preferably, 50 to 150 nm. The structure of the thin film transistor may be any one of a single drain structure, an LDD (lightly doped drain) structure, and a GOLD (gate-drain overlapped LDD) structure. The semiconductor film includes a channel formation region and an impurity region (having a source region, a drain region, a GOLD region, and an LDD region), and can be divided into an n-channel thin film transistor 128n or a p-channel thin film transistor 128p depending on the conductive type of the doped impurity elements. In order to prevent a short channel effect with miniaturizing the channel formation region, an insulator is formed over the side of the gate electrode to form a so-called side wall structure. Accordingly, a lightly doped impurity region is formed at the lower side of the insulator. The TFT layer 103 includes a wiring 130 connected to each of the impurity regions.

In order to prevent the TFT layer 103 from being etched, a base insulating film formed over the release layer 102 is preferably formed by a single layered or laminated layered insulating film including oxygen or nitrogen, for example, a silicon oxide (SiOx) film, a silicon nitride (SiNx) film, a silicon oxynitride (SiOxNy) film, a silicon nitride oxide (SiNxOy) film, (x>y)(x, y=1, 2 . . . ), or the like. As the base insulating film, a material that can be etched by an etching gas with an efficiently etching ratio between the release layer 102 and the base insulating film.

In this embodiment, the base insulating film includes a first insulating film 121, a second insulating film 122, and a third insulating film 123. A silicon oxide film is used as the first insulating film 121; a silicon oxynitride film is used as the second insulating film 122; and a silicon oxide film is used as the third insulating film 123. In consideration with impurity dispersion from the insulating substrate 100 or the like, the silicon oxynitride film is preferably used. However, there is fear that the silicon oxynitride film has low adhesiveness with respect to the release layer and the semiconductor film. Consequently, a silicon oxide film having high adhesiveness with respect to the release layer, the semiconductor film, and the silicon oxynitride film is provided.

The semiconductor film 124 may have any one of the state selected from the group consisting of an amorphous semiconductor; a SAS in which an amorphous state and a crystalline state are mixed; a microcrystalline semiconductor in which crystalline grain of 0.5 to 20 nm can be observed in an amorphous semiconductor; and a crystalline semiconductor.

In this embodiment, a crystalline semiconductor film is formed by forming an amorphous semiconductor film and crystallizing by heat treatment. As the heat treatment, heating furnace, laser irradiation, light irradiation emitted from a lamp (hereinafter, lamp annealing) instead of laser light, or combination of the foregoing can be used.

In the case of utilizing laser irradiation, a continuous wave laser beam (CW laser beam) or a pulse oscillating laser beam (pulse laser beam) can be used. As the laser beam, a laser beam oscillated from one kind or a plurality kinds selected from Ar laser, Kr laser, excimer laser, YAG laser, $Y_2O_3$ laser, $YVO_4$ laser, YLF laser, $YAlO_3$ laser, glass laser, ruby laser, alexandrite laser, Ti: sapphire laser, copper vapor laser, and gold vapor laser can be used. By emitting a laser beam of second to fourth harmonics of a fundamental harmonic in addition to a fundamental harmonic of the foregoing laser beams, a crystal having a large grain diameter can be obtained. For instance, a second harmonic (532 nm) or a third harmonic (355 nm) of Nd:$YVO_4$ laser (fundamental, 1064 nm) can be used as the laser beam of second to fourth harmonics of a fundamental harmonic. The laser requires energy density of approximately from 0.01 to 100 $MW/cm^2$ (preferably, approximately from 0.1 to 10 $MW/cm^2$). The laser is emitted at a scanning rate of approximately from 10 to 2000 cm/sec.

Figure 14A:
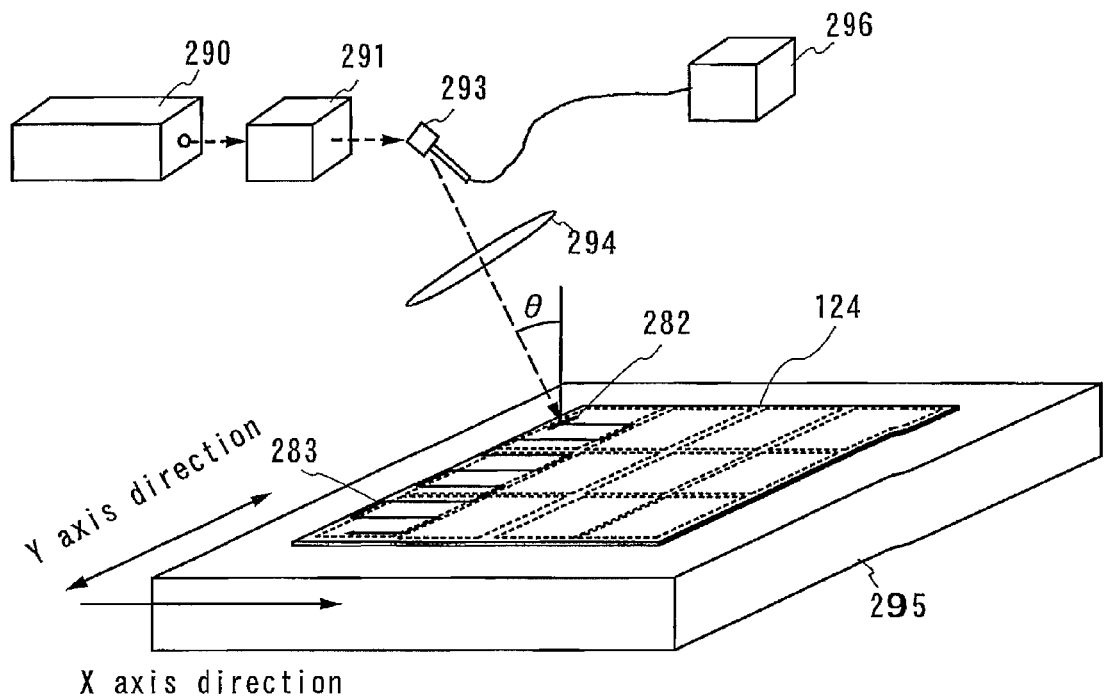
FIGS. 14A and 14B are views of illustrating laser irradiation in a manufacturing process of a thin film integrated circuit.

For instance, an optical system as illustrated in FIG. 14A is used to perform crystallization by using a CW laser device. First, a CW laser beam emitted from a laser oscillator 290 is extended by an optical system 291 to be processed into linear shape. Specifically, a laser beam is processed into a linear shape when passing through a cylindrical lens or convex lens of the optical system 291. At this time, the laser beam is preferably processed so that the beam spot has a length of a long axis of 200 to 350 μm.

Thereafter, the laser beam processed into a linear shape is entered into the semiconductor film 124 via a galvano mirror 293 and an fθ lens 294. The linear laser is adjusted to form a laser spot 282 having a predetermined size over the semiconductor film. By the fθ lens 294, the laser spot 282 can be formed to have a constant shape on a subject surface independently of the angle of the galvano mirror.

The galvano mirror is vibrated by a device 296 for controlling the vibration of the galvano mirror (control device), that is, the angle of the galvano mirror is varied. The laser spot 282 moves in one direction (for example, an X axis direction in the drawing). For instance, the galvano mirror is adjusted so that the laser beam moves in the X direction for a certain distance over the semiconductor film when the galvano mirror vibrates half cycle (back motion).

Thereafter, the semiconductor film 124 moves in a Y axis direction by an XY stage 295. Similarly, the laser spot moves over the semiconductor film in the X axis direction (forth motion). Laser irradiation can be performed by utilizing the back and forth motion of the laser beam by moving the laser spot in a course 283.

Figure 14B:
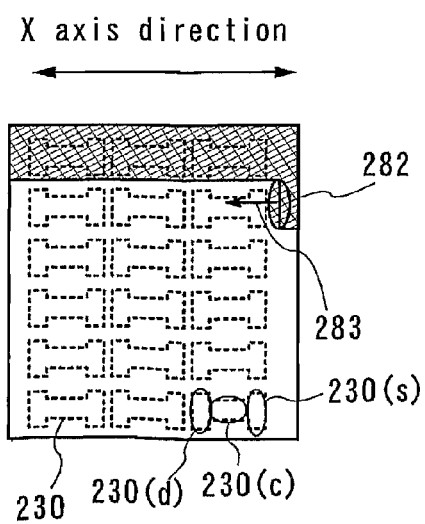

As illustrated in FIG. 14B, laser irradiation is performed so that a moving direction of carriers of a thin film transistor is along with a moving direction (scanning direction) in the X axis direction of the laser beam. For instance, in the case of the semiconductor film 124 having the shape illustrated in FIG. 14B, a source region, a channel formation region, and a drain region, each of which is provided to the semiconductor film, is arranged to be parallel with the moving direction (scanning direction) in the X axis direction of the laser beam. As a result, a grain boundary through which carriers pass can be reduced or removed, and so mobility of the thin film transistor can be improved.

An incident angle θ of the laser beam against the semiconductor film may be set 0°<θ<90°. As a result, interference of the laser beam can be prevented.

A continuous wave fundamental harmonic laser beam and a continuous wave higher harmonic laser beam may be emitted. Alternatively, a continuous wave fundamental harmonic laser beam and a pulse oscillation higher harmonic laser beam may be emitted. By emitting a plurality of laser beams, energy can be supplied.

A laser beam, which is a pulse oscillation laser beam, and which can oscillate laser at an oscillation frequency capable of emitting laser light of a next pulse during the period between melting due to laser light and solidifying of the semiconductor film can also be used. By oscillating the laser beam at such the frequency, crystal grains that are continuously grown in the scanning direction can be obtained. A specific oscillation frequency of the laser beam is 10 MHz or more. A notably higher frequency band is used than a frequency band of several ten to several hundreds Hz that is generally used.

The laser beam may be emitted in the presence of an inert gas such as a rare gas or nitrogen. Accordingly, a rough surface of a semiconductor due to the laser beam irradiation, flatness of the semiconductor surface can be improved, and variations of a threshold value due to variations of interface state density can be prevented.

Alternatively, a microcrystalline semiconductor film may be formed by using $SiH_4$ and $F_2$, or $SiH_4$ and $H_2$, and the microcrystalline semiconductor film may be crystallized by laser irradiation as mentioned above.

In the case of using a heating furnace as another heat treatment, an amorphous semiconductor film is heated at 500 to 550° C. for 2 to 20 hours. In this instance, the temperature is preferably set at multi-steps in the range of 500 to 550° C. so as to increase gradually. By an initial low temperature heating process, hydrogen or the like in the amorphous semiconductor film is released. Accordingly, so-called hydrogen releasing reaction can be performed, which leads to reduce roughness of a film surface due to crystallization. Moreover, a metal element that promotes crystallization, for example, nickel, is preferably fowled over the amorphous semiconductor film since heating temperature can be reduced. Even in the crystallization using the metal element, the amorphous semiconductor film can be heated at 600 to 950° C.

There is fear that the metal element is harmful for the electric characteristics of a semiconductor element, it is required to perform a gettering process for reducing or removing the metal element. For example, a process for trapping the metal element using the amorphous semiconductor film as a gettering sink is performed.

Alternatively, a crystalline semiconductor film may be formed directly over a subject surface. In this instance, the crystalline semiconductor film can be formed directly over the subject surface by using a fluoride gas such as $GeF_4$ or $F_2$, and a silane gas such as $SiH_4$ or $SiH_6$ and by utilizing heat or plasma. In the case that the crystalline semiconductor film is directly formed and high temperature processing is required, a quartz substrate having high heat resistance is preferably used as the insulating substrate 100.

By the foregoing process for heating the semiconductor film, the release layer 102 may be affected by the heating. In the case of performing heat treatment using a furnace or laser irradiation of light at a wavelength of 532 nm, energy may reach to the release layer 102. As a result, the release layer 102 may be crystallized. By such the crystalline state of the release layer 102, reaction rate can be controlled.

On the other hand, in order to crystallize efficiently the semiconductor film, the structure of the base insulating film can be selected so that energy by laser does not reach to the release layer 102. For example, it can be possible to make energy by laser not reach to the release layer 102 by selecting a material, a thickness, and a sequential order of the base insulating film.

The semiconductor film formed by any means as noted above has more hydrogen than an IC chip formed by a silicon wafer. Specifically, the semiconductor film can be formed to have hydrogen of $1\times10^{19}$ to $1\times10^{22}/cm^3$, preferably, $1\times10^{19}$ to $5\times10^{20}/cm^3$. The hydrogen can give so-called terminate effect by which a dangling bond in the semiconductor film can be relieved. Moreover, the hydrogen can improve bendability of a thin film integrated circuit.

By setting the proportion of the area occupied by the patterned semiconductor film in the thin film integrated circuit 1 to 30%, destruction and peeling due to bending stress of a thin film transistor can be prevented.

The thin film transistor having such the semiconductor film has subthreshold coefficient (S value) is 0.35 V/dec or less, preferably, 0.25 to 0.09 V/dec. The mobility of the foregoing thin film transistor is 10 $cm^2$/Vs or more.

In the case of composing a nineteen stage ring oscillator by such the TFT, the nineteen stage ring oscillator has a characteristic of an oscillation frequency of 1 MH or more, preferably, 100 MHz or more at an applied power supply voltage of 3 to 5 V. A delay time per a one step inverter is 26 ns, preferably, 0.26 ns or less at an applied power supply voltage of 3 to 5 V.

The thin film integrated circuit has an extreme thin semiconductor film as an active region, and so the thin film integrated circuit can be further reduced its thickness compared to an IC chip formed by a silicon wafer. The specific thickness of the thin film integrated circuit is 0.3 to 3 μm, typically, approximately 2 μm.

The function of a TFT can be given by the foregoing structure; a first interlayer insulating film 127 and a second interlayer insulating film 129 are preferably formed. Hydrogen in the first interlayer insulating film 127 can repair damage of a semiconductor film due to laser, a dangling bond, or the like. That is, a termination effect by hydrogen can be obtained. As the first interlayer insulating film 127, an insulating film having oxygen or nitrogen, for example, a silicon oxide (SiOx) film, a silicon nitride (SiNx) film, a silicon oxynitride (SiOxNy) film, a silicon nitride oxide (SiNxOy) film, (x>y)(x, y=1, 2 . . . ), or the like.

Flatness can be improved by the second interlayer insulating film 129. An organic material or an inorganic material can be used for the second interlayer insulating film 129. As the organic material, polyimide, acrylic, polyimide, polyimideamide, resist; or benzocyclobutene, siloxane, polysilazane can be used. The siloxane is composed of a skeleton formed by the bond of silicon (Si) and oxygen (O), in which an organic group containing at least hydrogen (such as an alkyl group or aromatic hydrocarbon) is included as a substituent, alternatively, a fluoro group may be used as the substituent, further alternatively, a fluoro group and an organic group containing at least hydrogen may be used as the substituent. The polysilazane is made from a liquid material including a polymer material having the bond of silicon (Si) and nitrogen (Ni) as a starting material. As the inorganic material, an insulating film having oxygen or nitrogen, for example, a silicon oxide (SiOx) film, a silicon nitride (SiNx) film, a silicon oxynitride (SiOxNy) film, a silicon nitride oxide (SiNxOy) film, (x>y)(x, y=1, 2 . . . ), or the like can be used. The second interlayer insulating film 129 may be formed by a layered structure composed of the foregoing insulating films. In the case that the second interlayer insulating film 129 is formed by using an organic material, the flatness of the second interlayer insulating film 129 is improved; however, the absorption level of the second interlayer insulating film 129 of moisture or oxygen is increased. To prevent that, an insulating film having an inorganic material is preferably formed over the organic material. In the case of using an insulating film including nitrogen, penetration of alkali ions such as Na can be prevented in addition to moisture.

More preferably, a fourth insulating film 131 is formed to cover the wiring 130. Since most goods installed with a thin film integrated circuit are touched by hands, there is fear that alkali ions such as Na are dispersed. Therefore, as the fourth insulating film 131, an insulating film having oxygen or nitrogen, for example, a silicon oxide (SiOx) film, a silicon nitride (SiNx) film, a silicon oxynitride (SiOxNy) film, a silicon nitride oxide (SiNxOy) film, (x>y)(x, y=1, 2 . . . ), or the like can be used, typically, the silicon nitride oxide (SiNxOy) film is preferably used.

Thereafter, a groove (also referred to as an opening portion) 105 is formed between thin film integrated circuits 101. The groove 105 can be formed by dicing, scribing, etching using a mask, or the like to have a circular shape (corresponding to so-called bore), a rectangular shape (corresponding to so-called slit), or the like. In the case of using the dicing, a blade dicing method using a dicing device (so-called dicer) is generally used. The blade is a whetstone embedded with diamond abrasive grains with a width of approximately 30 to 50 μm. The TFT layer 103 is divided by rotating the blade at high speed. As the scribing method, a diamond scribing method and a laser scribing method can be used. In the case of using the etching method, the TFT layer 103 can be divided by forming a mask pattern by exposure and developing process to be etched by dry etching or wet etching. An atmospheric plasma method can be used in performing the dry etching. As noted above, the groove 105 can be formed between the thin film integrated circuits 101.

The groove 105 is not always formed between each of the thin film integrated circuits, but between regions provided with a plurality of thin film integrated circuits.

Figure 5:
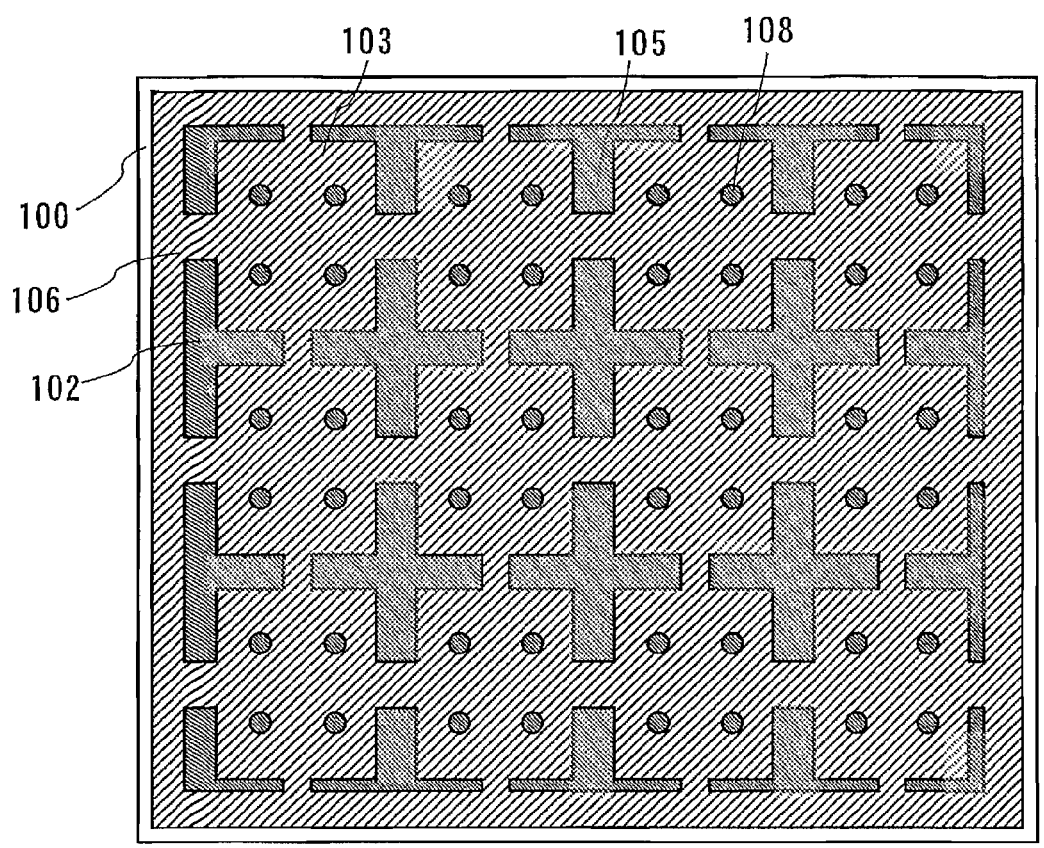
FIG. 5 is a view of illustrating a manufacturing process of a thin film integrated circuit.

As illustrated in FIG. 5, an opening portion 108 may be formed in the TFT layer 103. The opening portion is required to be formed in except a region provided with a conductive film serving as a channel formation region. By using both the groove and the opening portion, the size and number of the groove 105 can be adjusted and the time required to remove the release layer can be reduced. The opening portion may be a circular shape, a rectangular shape, or the like. The shape or the number of the opening portion is not limited to that illustrated in FIG. 5.

In the case of selectively forming the groove at the boundary of the thin film integrated circuits 101, an insulating film, a conductive film, and the like are remained in except the region of the groove 105 between the thin film integrated circuits. Such the remained insulating film, conductive film, and the like are referred to as a connection region 106. The connection region 106 may have a function to make the thin film integrated circuits are integrated with each other. Therefore, the connection region 106 may have either of the insulating film or the conductive film, and may be formed to have either of a single layered structure of a layered structure.

The thin film integrated circuits 101 are fixated to the insulating substrate 100 at the region 104 that is not provided with the release layer 102. Accordingly, the thin film integrated circuits 101 are not depart from the insulating substrate 100.

Figure 2A:
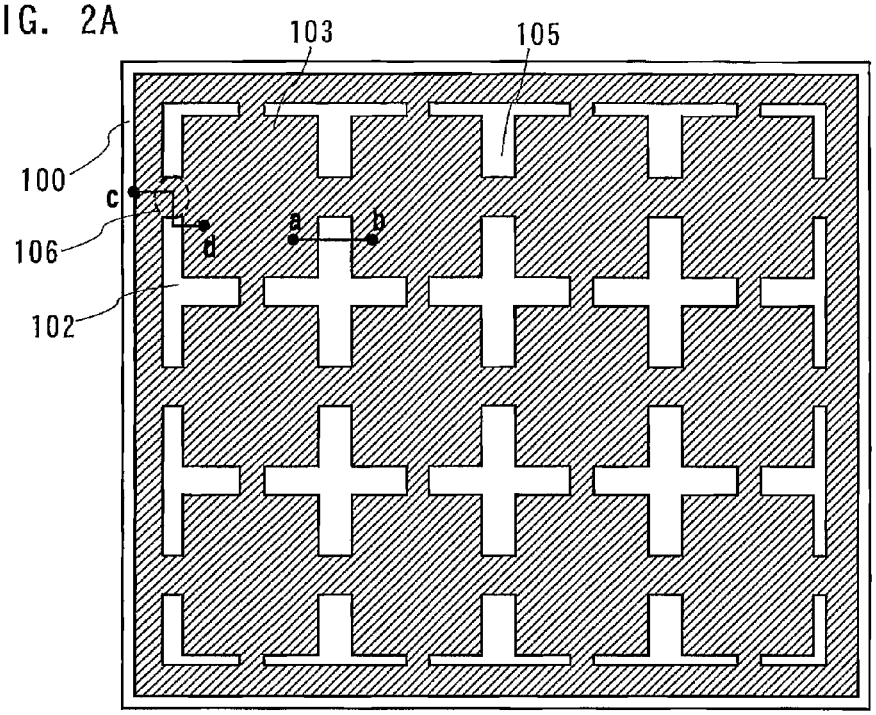
FIGS. 2A to 2C are views of illustrating a manufacturing process of a thin film integrated circuit.
Figure 2B:
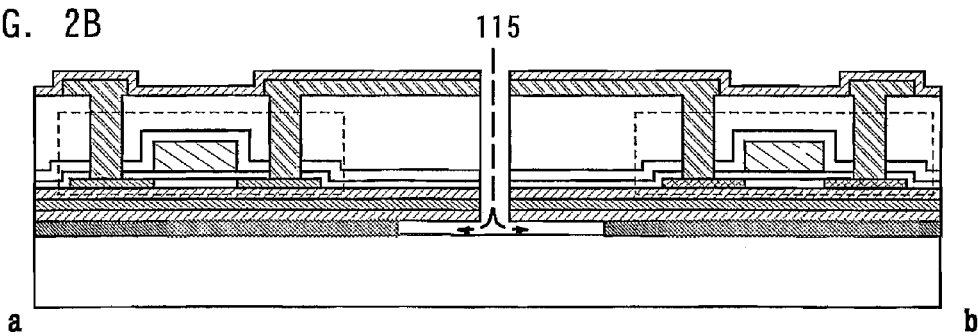
Figure 2C:
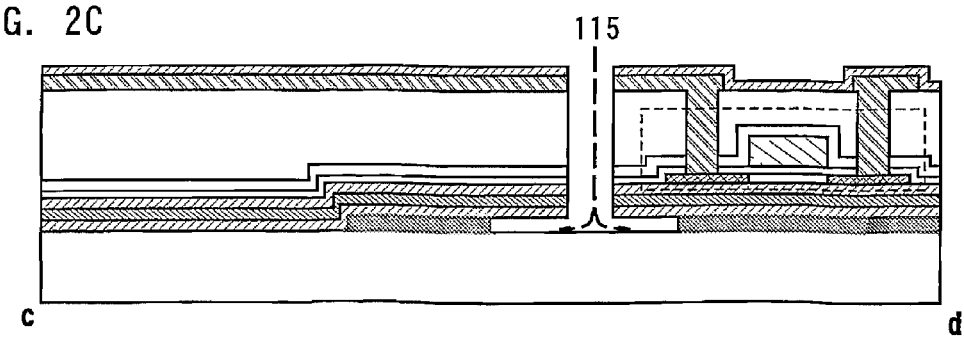

As illustrated in FIGS. 2A to 2C, the release layer 102 is removed in this state. FIG. 2A is a top view. FIG. 2B is a cross-sectional view of FIG. 2A taken along line a-b. FIG. 2C is a cross-sectional view of FIG. 2A taken along line c-d.

An etching agent 115 for removing the release layer 102 is introduced. As the etching agent 115, gas or liquid containing halogen fluoride can be used. As the halogen fluoride, for example, $ClF_3$ (chlorine trifluoride) can be used. The $ClF_3$ can be prepared by the process of $Cl_2(g)+3F_2(g)\rightarrow 2ClF_3(g)$. The $ClF_3$ may be liquid depending on the temperature of a reaction space (boiling point 11.75° C.). In this instance, wet etching can be adopted by using liquid including the halogen fluoride. As gas including another halogen fluoride, gas composed of nitrogen mixed with $ClF_3$ or the like can be used.

The etching agent is limited to neither the $ClF_3$ nor halogen fluoride. Any material that etch the release layer 102 but the base insulating film can be used as the etching agent. For instance, plasma processed gas containing fluorine such as $CF_4$, $SF_6$, $NF_3$, or $F_2$ can be used. As other etching agents, strongly alkaline solution such as tetra-methyl ammonium hydroxide (TMAH) can be used.

When following the condition that a material that is selectively etched is used for the release layer 102 and a material that is not etched is used for the base film in the case of chemically removing the release layer 102 by gas including halogen fluoride such as $ClF_3$, the combination of the release layer 102 and the base insulating film is not limited to the foregoing materials.

Figure 15:
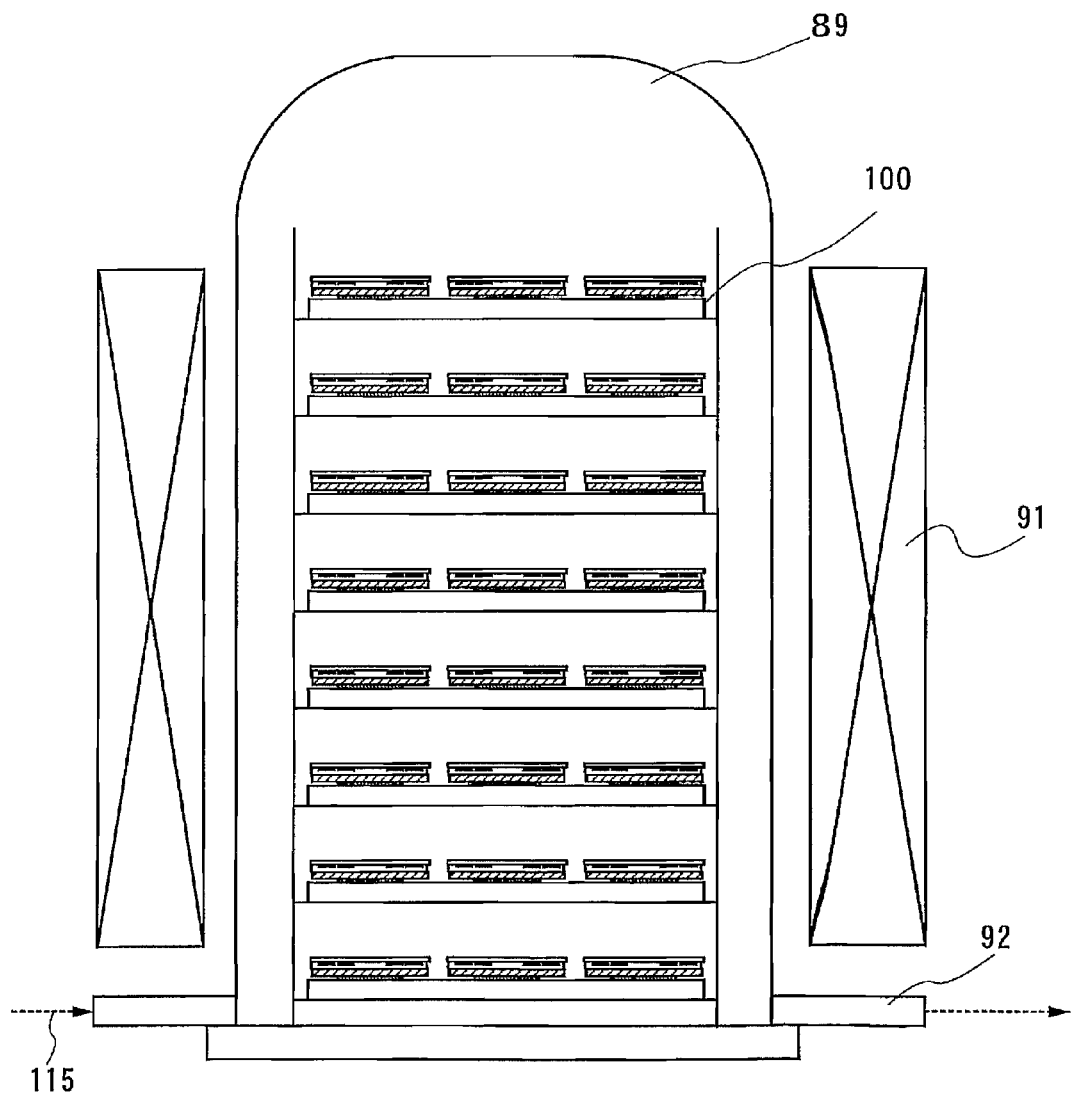
FIG. 15 is a view of illustrating a manufacturing process of a thin film integrated circuit.

In this embodiment, the release layer 102 can be removed by using a reduced pressure CVD device that can process at once a plurality of substrates as illustrated in FIG. 15 under the condition, but not exclusively, that is, an etching agent of $ClF_3$ (chlorine trifluoride) gas, temperature of 350° C., a flow amount of 300 sccm, atmospheric pressure of 6 Torr, and time of 3 hours. By the reduced pressure CVD device, mass productivity of the thin film integrated circuits can be improved.

As the reduced pressure CVD device illustrated in FIG. 15, a bell jar 89 that can process a plurality of substrates 100 is used. $ClF_3$ 115 is introduced from a gas introduce pipe and excess gas is exhausted from an exhaust pipe 92. There is no fear that the thin film integrated circuits are drawn into the exhaust pipe 92 since the thin film integrated circuits are integrated with the insulating substrate 100.

Further, a heating means, for example, a heater 91 may be provided to the side of the reduced pressure CVD device. By the heating means, reaction rate of the release layer 102 and the etching agent can be increased at a processing temperature of 100 to 300° C. As a result, the etching agent use can be reduced, and the processing time can be reduced.

By introducing such the etching agent, the release layer 102 can be gradually put into reverse to be removed.

When introducing the etching agent, gas flow rate, temperature, and the like are set so that the TFT layer 103 is not etched. The $ClF_3$ used in this embodiment can remove selectively the release layer 102 since it has a characteristic of etching selectively silicon. In order not to be etched the TFT layer 103, an insulating film including oxygen or nitrogen is preferably used as the base insulating film. Since the difference in a reaction rate, that is, selective ratio, between the release layer and the base insulating film is large; the release layer 102 can be removed readily while protecting the thin film integrated circuits. In this embodiment, the reaction of the TFT layer with the etching agent can be prevented by silicon oxynitride or the like provided above and below the TFT layer 103, and the exposed side surface of the interlayer insulating film, the gate insulating film, the wiring, and the like.

A process after removing the release layer 102 is explained with reference to FIGS. 3A to 4C. As illustrated in FIG. 3A, the release layer 102 is removed. Then, as illustrated in FIG. 3B, a means provided with an adhesion surface 140 for fixating the thin film integrated circuits 101 is pasted. As a means for providing the adhesion surface, silicon rubber, perfluoroelastomer, Fluon Aflas, Teflon rubber, and the like can be used. Especially, the perfluoroelastomer and the Fluon Aflas have high heat resistance and high chemical resistance, and so they are preferably used.

Thereafter, as illustrated in FIG. 3C, the insulating substrate 100 is separated (also referred to as divorced). In this instance, the adhesive strength of the means provided with an adhesion surface 140 is set to be higher than that of the region 104 that is not provided with the release layer. Note that the region 104 that is not provided with the release layer is directly formed over the insulating substrate 100 to have strong adhesive force, and so the region 104 that is not provided with the release layer may be remained over the insulating substrate 100. That is, the adhesive strength of the region 104 that is not provided with the release layer can be set so as to resist the separation of the insulating substrate 100. The thin film integrated circuits are connected to each other by the connection region 106.

The separated insulating substrate 100 can be reused. As a result, the cost of the thin film integrated circuits can be reduced. In the case of reusing the insulating substrate 100, it is desired to control the insulating substrate 100 so as not to be damaged by dicing, scribing, or the like. However, despite of being damaged, organic resin or inorganic film formed by coating or droplet discharging to be planarized can be used. The droplet discharging is a method of discharging (squirting) droplets (also referred to as dots) of a composition mixed with a material for a conductive film or insulating film. The method is also referred to as an ink jetting method depending on its system. The insulating substrate 100 can be polished to remove the groove 105 and to perform a planarizing process.

Figures 4A, 4B, 4C:
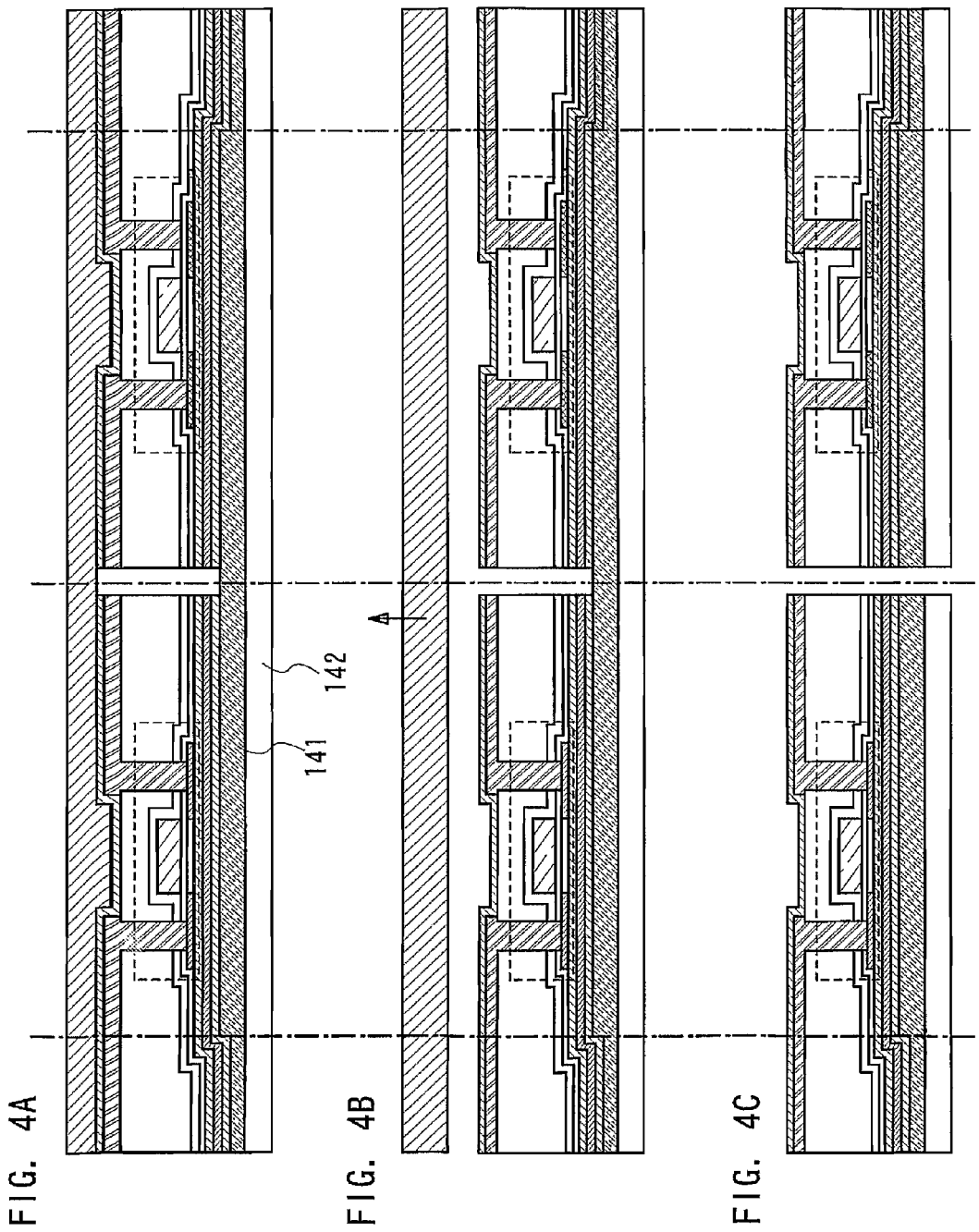
FIGS. 4A to 4C are views of illustrating a manufacturing process of a thin film integrated circuit.

As illustrated in FIG. 4A, the thin film integrated circuits can be pasted onto another substratum 142 with an adhesive 142. Another substratum 142 is preferably a flexible substrate. As the flexible substrate, a substrate made from plastic as typified by poly ethylene telephtharate (PET), poly ethylene naphtharate (PEN), or poly ether sulfone (PES); or synthetic resin having flexibility such as acrylic can be used.

As the adhesive 141, an adhesive such as heat curing resin, ultraviolet curing resin, epoxy resin adhesive, or resin additive; a two-sided tape; or the like can be used.

Moving to the flexible substrate can improve the flexibility and the breaking strength of the thin film integrated circuit. Compared to the thin film integrated circuit formed over the insulating substrate 100, the thin film integrated circuit over the flexible substrate can be formed to have lightweight, a thin thickness, and high flexibility.

Another substrate 142 can be the surface of good on which the thin film integrated circuits are mounted. That is, the thin film integrated circuits can be mounted on the good by removing the insulating substrate 100. Therefore, the thin film integrated circuits can be reduced its thickness, and the good mounted with the thin film integrated circuits can be reduced its thickness and weight.

As illustrated in FIG. 4B, the means provided with an adhesion surface 140 is removed. Consequently, the adhesive strength of the means provided with an adhesion surface 140 is set lower than that of the adhesive 141.

Lastly, as illustrated in FIG. 4C, the thin film integrated circuit is cut by a dicing, scribing, or laser cutting method. For instance, the thin film integrated circuits can be cut by utilizing laser absorbed in another substratum 142. As the laser, $CO_2$ to laser can be used.

Further, organic resin such as epoxy resin may be filled to the periphery of the side of the thin film integrated circuits. Accordingly, the thin film integrated circuits can be protected from the outside and becomes in a form capable of being easily portable.

The thin film integrated circuits can be cut into 5 mm square (25 mm$^2$) or less, preferably, 0.3 mm square (0.09 mm$^2$) to 4 mm square (16 mm$^2$).

In the case of forming a thin film integrated circuit over such the insulating substrate 100, there is no limitation on a mother substrate shape, which is different from an IC chip taken from a circular silicon wafer. Therefore, mass production of thin film integrated circuits is possible. Moreover, the cost can be reduced since the insulating substrate 100 can be reused.

Different from an IC chip formed by a silicon wafer, the thin film integrated circuit according to the present invention has characteristics that a semiconductor film having a thickness of, typically, 40 to 170 nm, preferably, 50 to 150 nm as an active region, and is formed to have an extreme thin thickness. As a result, in the case of being mounted on a good, it is difficult to identify whether the thin film integrated circuit exists in the good, which leads to prevent alteration.

Such the thin film integrated circuit can be moved to a flexible substrate, and so it is hardly broken compared to an IC chip formed by a silicon wafer. Therefore, strength of the thin film integrated circuit can be improved.

Since the thin film integrated circuit according to the present invention has not a silicon wafer, it can receive high sensitive signals without worry of electronic wave absorption, which is different from an IC chip formed by a silicon wafer.

Since the thin film integrated circuit according to the present invention has not a silicon wafer, it can be transparent to light. As a result, the thin film integrated circuit does not detract from the design of a good even if it is mounted on a print surface of the good.

The thin film integrated circuit according to the present invention can obtain electric power or signals from an antenna. The antenna can be formed on the thin film integrated circuit. Further, an antenna provided separately to a substrate can be pasted onto the thin film integrated circuit. As used herein, the term of "paste" refers to fix by a material having an adhesion property in addition to bond with an adhesive.

In detail, a chip having a thin film integrated circuit, that is, an IDF chip, has various kinds such as a non-contact IDF chip (also referred to as a wireless tag), a contact IDF chip forming a terminal for connecting to an external power source without antenna, and a hybrid IDF chip that is a mixture of the non-contact type and the contact type. The thin film integrated circuit explained in this embodiment can be applied to any one of the non-contact IDF chip, the contact IDF chip, and the hybrid IDF chip.

That is, the method for manufacturing a thin film integrated circuit has an effect of preventing any of the non-contact IDF chip, the contact IDF chip, and the hybrid IDF chip from being dispersed.

To form the thin film integrated circuit over the insulating substrate 100, there is no limitation on a mother substrate shape, which is different from an IC chip formed by a circular silicon wafer. Therefore, mass productivity of the thin film integrated circuit is improved, and mass production of the thin film integrated circuit can be realized. As a result, the cost of the thin film integrated circuit can be reduced. The unit price of the thin film integrated circuit is extremely low, and so the thin film integrated circuit can make remarkably large profits.

The number and the like of thin film integrated circuit that is taken from a silicon wafer having a diameter of 12 inches is compared to that taken from a glass substrate of 7300×9200 mm². The area of the silicon wafer is approximately 73000 mm², whereas the area of the glass substrate is 672000 mm². The glass substrate is approximately 9.2 times large as the silicon wafer. When setting aside the area consumed by cutting the substrate, approximately 672000 pieces of thin film integrated circuits of 1 mm square can be taken from the glass substrate by arithmetic. The number of pieces is approximately 92 times large as that of the silicon wafer. The business investment for mass production of the thin film integrated circuit of the case of using the glass substrate of 7300×9200 mm² can be one-third of the case of using the silicon wafer having a diameter of 12 inches, since the number of manufacturing processes of the case of using the glass substrate is smaller than that of the case of using the silicon wafer.

Embodiment 2

In this embodiment, an example of a manufacturing device of the thin film integrated circuit explained in Embodiment 1 is explained.

Figure 6:
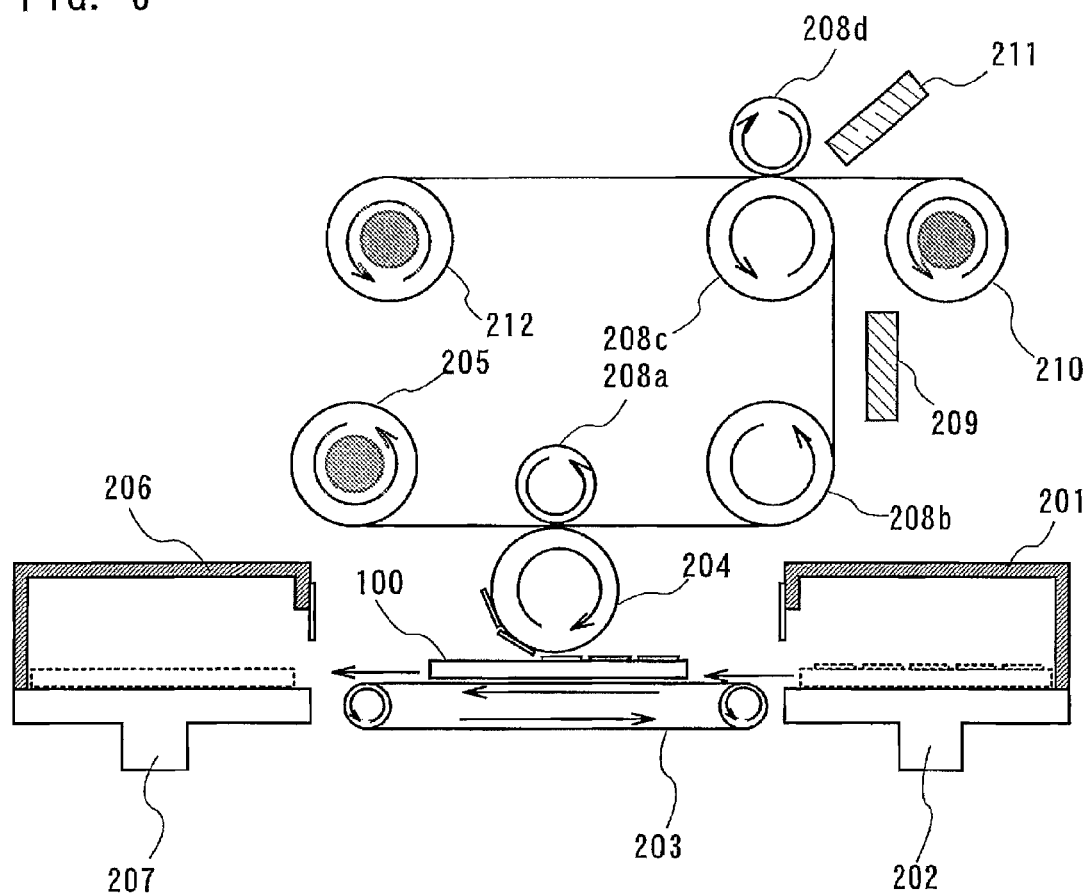
FIG. 6 is a view of illustrating a manufacturing process of a thin film integrated circuit.

FIG. 6 illustrates a delivery carrier 201, a delivery elevator 202, a belt conveyor 203, a transportation roll 204, a film delivery roll 205, a discharge carrier 206, a discharge elevator 207, rollers 208a, 208b, 208c, and 208d, an operation evaluation device 209, a film delivery roll 210, an alignment device 211, and a take-up roll 212. A thing provided with an adhesion surface with respect to an upper surface of the thin film integrated circuit, that is, so-called tape, is delivered from the film delivery roll 205.

As illustrated in FIGS. 2A-C, a thin film integrated circuit in which a release layer 102 is removed is arranged over the belt conveyor 203 by transporting from the delivery carrier 201. Then, the thin film integrated circuit connected by a connection region 106 is transposed to the transportation roller 204 that corresponds to a support substrate having the adhesion surface (the transportation roller 204 also corresponds to the means provided with an adhesion surface for fixating the thin film integrated circuits, the means for pressing the integrated circuit, and the means for fixating a thin film integrated circuit). The transportation roller 204 can be formed by silicon resin or fluoride resin. Specifically, silicon rubber, perfluoroelastomer, Fluon Aflas, Teflon rubber, and the like can be used. Especially, the perfluoroelastomer and the Fluon Aflas have high heat resistance and high chemical resistance, and so they are preferably used.

In order to set the adhesion strength of the delivery roller 204 higher than that between the substrate 100 and a region 104 that is not provided with the release layer 102, only the thin film integrated circuit is transposed and an insulating substrate 100 is moved by the belt conveyor 203. Note that at least part of the region 104 that is not provided with the release layer 102 can be remained over the insulating substrate 100 since it is directly formed on the insulating substrate. That is, the adhesion strength of the region 104 that is not provided with the release layer 102 may be set so as to resist the separation of the insulating substrate 100.

The insulating substrate 100 can be collected to reuse. That is, the processes illustrated in FIGS. 3B, 3C, 4A, and 4B can be efficiently performed by the delivery roller 204.

Thereafter, a film provided with an adhesion surface, for example, a Scotch tape, a Tackwell tape (extreme thin single-faced tape), a Double Tack tape (extreme thin double-faced tape), each of which is adhered to an extreme thin film, or the like is delivered from the film delivery roll 205. These films have preferably resistance to an etching gas and high heat resistance. Then, the film provided with an adhesion surface can be adhered to the transported thin film integrated circuit by the roller 208a. As the film provided with an adhesion surface, a film having strong adhesion strength such as a hot melt film can be used.

An antenna may be provided to the film provided with an adhesion surface. In this instance, an alignment device is preferably provided to the vicinity of the roller 208a. In the case that the distances of the antenna and the thin film integrated circuit are different from each other, the antenna may be provided to an extensible film to be pasted onto the thin film integrated circuit while pulling the film.

The thin film integrated circuit pasted with the film passes anterior to the operation evaluation device 209 by the roller 208b or the like. At this moment, the operation of the thin film transistor can be confirmed. For instance, when the thin film integrated circuit is transported, a predetermined signal is recorded by using a reader/writer as the operation evaluation device, and the operation can be confirmed from the fact whether the thin film integrated circuit returns the signal or not.

Since approximately 672000 pieces of ID tags of 1 mm square can be manufactured in the case of forming the thin film integrated circuit by using a glass substrate of 7300×9200 mm², the confirmation of operation is carried out for randomly selected thin film integrated circuits.

Thereafter, a film serving as a protective film (protective film), for example, a film for being laminated, a Scotch tape, a Tackwell tape (extreme thin single-faced tape), a Double Tack tape (extreme thin double-faced tape), each of which is adhered to an extreme thin film, or the like is delivered from the film delivery roll 210. These films have preferably resistance to an etching gas and high heat resistance. The alignment of adhering is controlled by the alignment device 211, for example, a CCD camera, the protective film is adhered to the thin film integrated circuit.

Lastly, the completed thin film integrated circuit is taken up by the taken-up roll 212.

Thereafter, the thin film integrated circuit is cut when it is mounted on a good as illustrated in FIG-4C. Accordingly, the thin film integrated circuit in the state of being taken up by the taken-up roll 212 can be transported or traded. As a result, extreme fine thin film integrated circuits of 5 mm square (25 mm²) or less, preferably, 0.3 mm square (0.09 mm²) to 4 mm square (16 mm²) can be readily manufactured, transported, or traded without being dispersed.

Embodiment 3

In this embodiment, a method for manufacturing a thin film integrated circuit by using a means for pressing the thin film integrated circuit as a means for fixation is explained. Like structure such as the thin film integrated circuit as in Embodiment 1 is not further described in this embodiment, but another structure is explained.

Figure 7A:
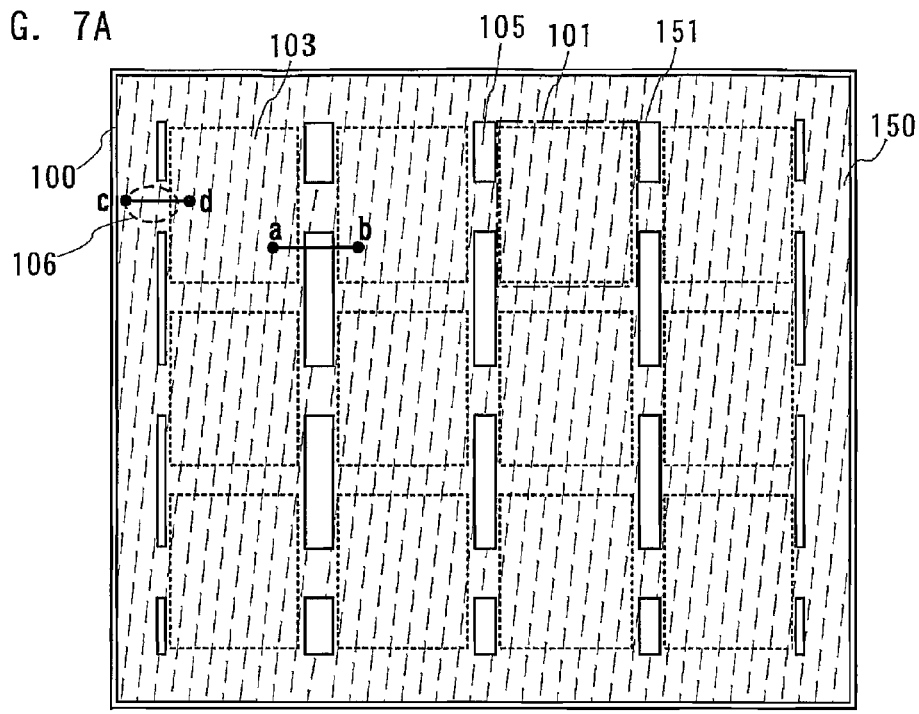
FIGS. 7A to 7C are views of illustrating a manufacturing process of a thin film integrated circuit.
Figure 7B:
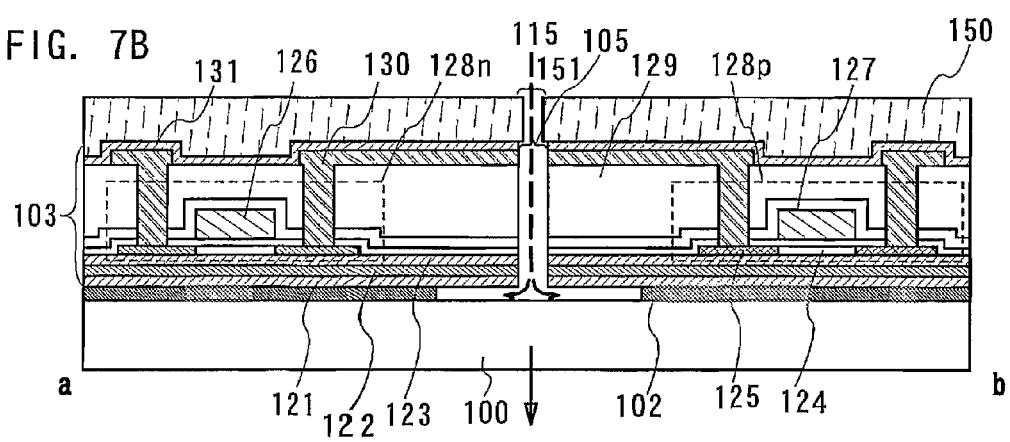
Figure 7C:
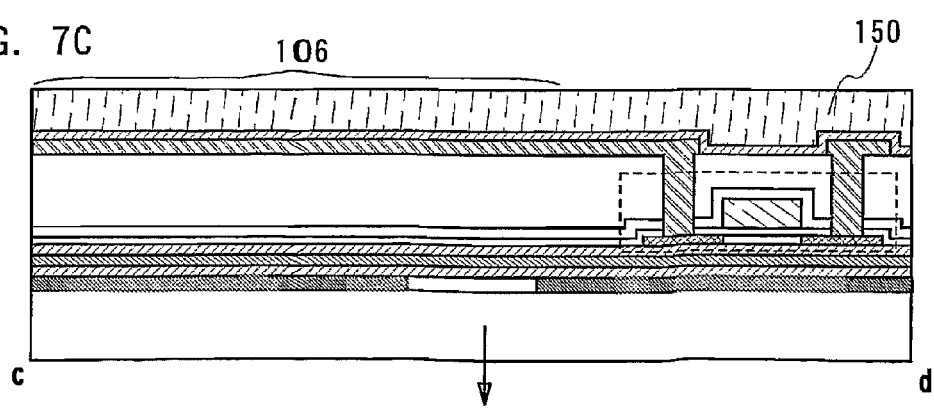

As illustrated in FIG. 7A, a plurality of thin film integrated circuits 101 is formed by sequentially forming a release layer 102 and a TFT layer 103 having a semiconductor film as an active region over an insulating substrate 100 as is the case with Embodiment 1. FIG. 7B is a cross-sectional view of FIG. 7A taken along line of a-b, whereas FIG. 7C is a cross-sectional view of FIG. 7A taken along line of c-d.

Different from Embodiment 1, a region that is not provided with the release layer 102 may not be provided. That is, the release layer 102 is formed over the entire surface of the insulating substrate 100. Therefore, a connecting region 106 can occupy a large area.

After forming the TFT layer 103, a groove 105 is formed as is the case with Embodiment 1.

Thereafter, a means for pressing the thin film integrated circuit 150 is pasted. As used herein, the term "paste" refers to fix by an adhesion property in addition to bond with an adhesive. The means for pressing the thin film integrated circuit can be formed by silicon resin or fluoride resin. Specifically, silicon rubber, perfluoroelastomer, Fluon Aflas, Teflon rubber, and the like can be used. Especially, the perfluoroelastomer and the Fluon Aflas have high heat resistance and high chemical resistance, and so they are preferably used.

An opening portion 151 is provided to the means for pressing the thin film integrated circuit 150. The opening portion 151 may be a circular shape, a rectangular shape, or the like, which is not limited to that illustrated in FIG. 7. The opening portion 151 is formed to overlap with the groove 105. Note that the shape, size, or number of the opening portion 151 may not be the same as that of the groove 105. Thus, the shape, size, or number of the opening portion 151 may be set so that an etching agent for removing the release layer 102 can be introduced. Further, the opening portion 151 and the groove 105 can be simultaneously formed.

Thereafter, an etching agent 115 is introduced to the opening portion 151 and the groove 105 in the state of pasting the means for pressing the thin film integrated circuit to remove the release layer. As the etching agent, an agent that does not react to the means for pressing the thin film integrated circuit is used. Specific etching agent, processing time, and the like can be referred to Embodiment 1. Then, the insulating substrate 100 is separated.

As noted above, the thin film integrated circuits can be prevented from being dispersed by the means for pressing the thin film integrated circuit 150.

Figure 8A:
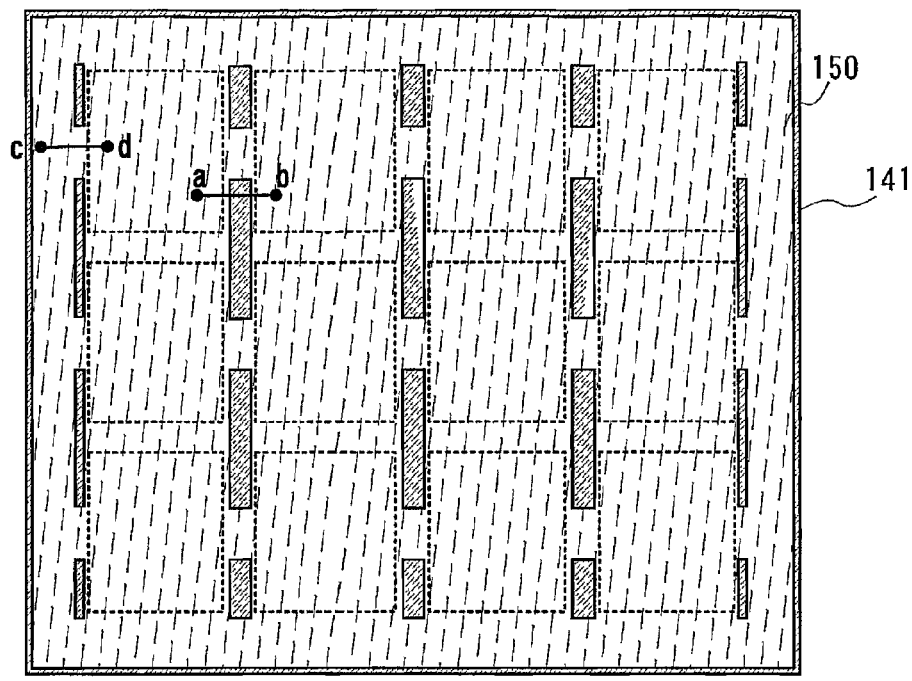
FIGS. 8A to 8C are views of illustrating a manufacturing process of a thin film integrated circuit.
Figure 8B:
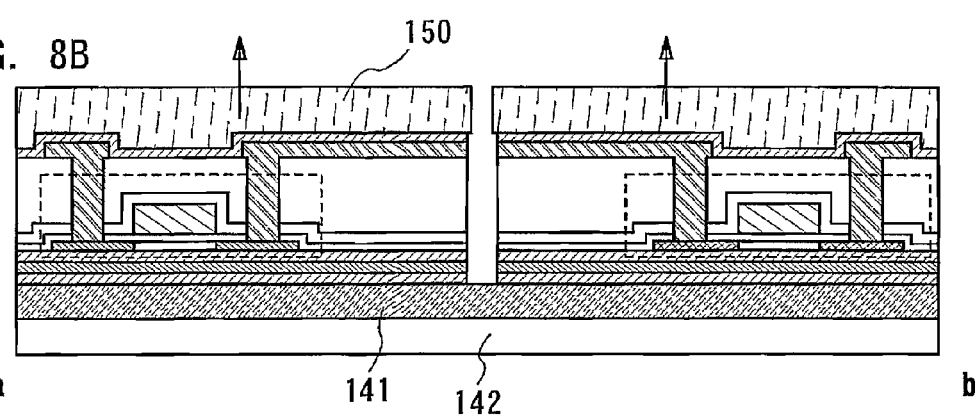
Figure 8C:
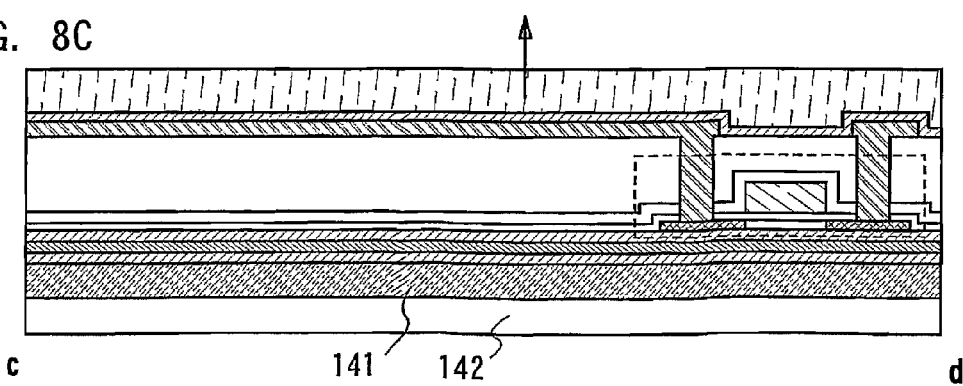

Thereafter, as illustrated in FIGS. 8A to 8C, the thin film integrated circuit can be pasted onto another substratum 142 by using an adhesive 141. FIG. 8B is a cross-sectional view of FIG. 8A taken along line of a-b, whereas FIG. 8C is a cross-sectional view taken along line of c-d. Then, the means for pressing the thin film integrated circuit 150 is removed. Therefore, the adhesion strength of the means for pressing the thin film integrated circuit 150 is set lower than that of the adhesive 141.

Figure 9A:
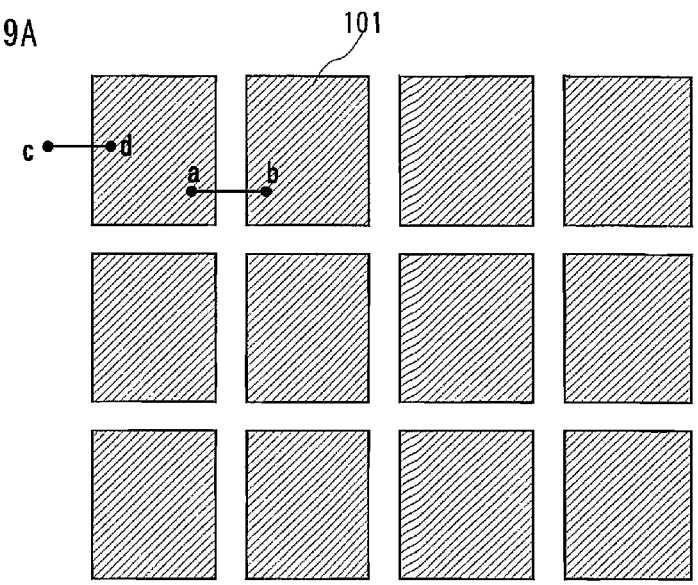
FIGS. 9A to 9C are views of illustrating a manufacturing process of a thin film integrated circuit.
Figure 9B:
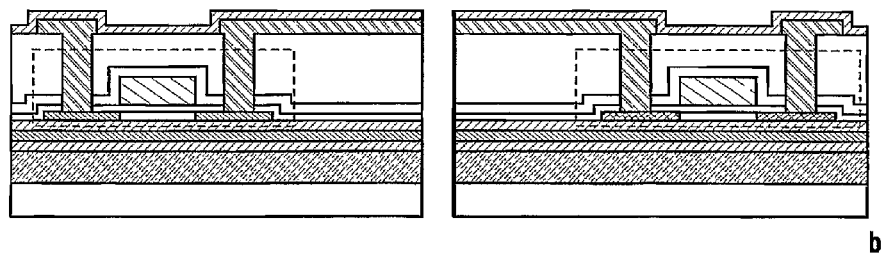
Figure 9C:
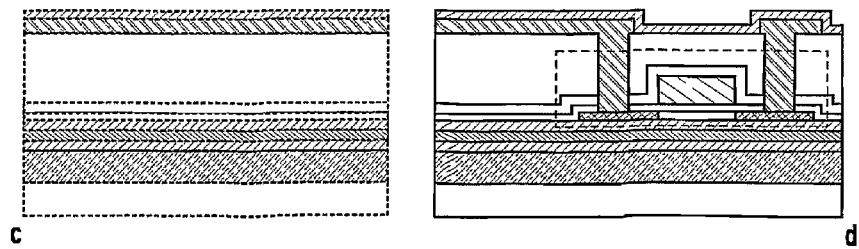

As illustrated in FIGS. 9A to 9C, the thin film integrated circuit is divided by a dicing, scribing, or laser cutting method. FIG. 9B is a cross-sectional view of FIG. 9A taken along line of a-b, whereas FIG. 9C is a cross-sectional view of FIG. 9A taken along line of c-d.

Organic resin such as epoxy resin may be filled to the periphery of the side of the thin film integrated circuits. Accordingly, the thin film integrated circuits can be protected from the outside and becomes in a form capable of being easily portable.

The thin film integrated circuits can be cut into 5 mm square (25 mm²) or less, preferably, 0.3 mm square (0.09 mm²) to 4 mm square (16 mm²).

In the case of forming a thin film integrated circuit over such the insulating substrate 100, there is no limitation on a mother substrate shape that is different from an IC chip taken from a circular silicon wafer. Therefore, mass production of thin film integrated circuits is possible. Moreover, the cost can be reduced since the insulating substrate 100 can be reused.

Different from an IC chip formed by a silicon wafer, the thin film integrated circuit according to the present invention has characteristics that the thin film integrated circuit has a semiconductor film with a thickness of, typically, 40 to 170 nm, preferably, 50 to 150 nm as an active region, and is formed to have an extreme thin thickness. As a result, it is difficult to identify whether the thin film integrated circuit exists in the case of being mounted on a good, which leads to prevent alteration.

In the case of improving the strength of such the low-profile thin film integrated circuit, the thin film integrated circuit can be shifted to a flexible substrate. Accordingly, the thin film integrated circuit has a characteristic of being hardly broken compared to an IC chip formed by a silicon wafer.

Since the thin film integrated circuit according to the present invention has not a silicon wafer, it can receive sensitive signals without worry of electronic wave absorption compared to an IC chip formed by a silicon wafer.

Since the thin film integrated circuit according to the present invention has not a silicon wafer, it can be transparent to light. As a result, the thin film integrated circuit does not detract from the design of a good even if it is mounted on a print surface of the good.

The thin film integrated circuit according to the present invention can obtain electric power or signals from an antenna. The antenna can be formed on the thin film integrated circuit. Further, an antenna provided separately to a substrate can be pasted onto the thin film integrated circuit. As used herein, the term "paste" refers to fix by an adhesion property in addition to bond with an adhesive.

That is, the method for manufacturing a thin film integrated circuit can prevent any one of the non-contact IDF chip, the contact IDF chip, and the hybrid IDF chip from being dispersed.

Embodiment 4

In this embodiment, a manufacturing device of the thin film integrated circuit explained in Embodiment 3 is explained.

FIGS. 13A to 13E illustrate a delivery carrier 401, a substrate carrying arm 400, a jig 403, an etching agent introducing chamber 405, an etching agent inlet 406, an etching outlet 407, a jig carrying arm 408, a belt conveyor 410, a film delivery roll 411, a taken-up roll 412, a film delivery roll 413, and an alignment device 414.

As illustrated in FIG. 13A, the thin film integrated circuit before removing a release layer 102 is transported from the delivery carrier 401 by using a delivery elevator 402. At this time, the thin film integrated circuits can be transported without being dispersed by the release layer 102.

As illustrated in FIG. 13B, the thin film integrated circuit formed over an insulating substrate 100 is held between the substrate carrying arm 400 to be lifted, and placed in the etching agent introducing chamber 405. Alternatively, the thin film integrated circuit formed over an insulating substrate 100 is scooped up and placed in the lower part of the chamber 405. It is not limited to use the substrate carrying arm 400. Any means that can place the thin film integrated circuit formed over an insulating substrate 100 in the chamber 405 can be used.

At this time, a jig 403 is placed in the chamber 405. The jig is preferably placed in such a way that the side of the jig is sandwiched since the jig is removable. The jig 403 can be formed by silicon resin or fluoride resin. Specifically, silicon rubber, perfluoroelastomer, Fluon Aflas, Teflon rubber, and the like can be used. An opening portion (corresponding to reference numeral 151) is provided along the region between the thin film integrated circuits, that is, the groove 105. As illustrated in FIG. 13D, the jig 403 is pressed at the thin film integrated circuit when the chamber 405 is closed. The jig 403 serves as a means for pressing the thin film integrated circuit.

In this state, an etching agent is introduced from the etching agent inlet 406 and exhausted from the etching agent outlet 407. The etching agent passes through the opening portion provided to a means for pressing the thin film integrated circuit located above the chamber 405, and removes the release layer 102 to separate the insulating substrate 100. The separated insulating substrate can be reused. At this time, the insulating substrate 100 remained in the chamber 405 may be taken out by the jig or the like. As noted above, the process illustrated in FIG. 7 is efficiently performed.

After removing the release layer 102, as illustrated in FIG. 13E, the thin film integrated circuit is adhered to the jig carrying arm 408 and the jig 403 to be moved. As the jig 403, for example, silicon rubber can be used. The thin film integrated circuits can be prevented from being dispersed by the jig 403.

Thereafter, the thin film integrated circuit is transported to a film provide with an adhesion surface, for example, a Scotch tape, a Tackwell tape (extreme thin single-faced tape), a Double Tack tape (extreme thin double-faced tape), each of which is adhered to an extreme thin film and sent from the film delivery roll 411, or the like. Therefore, the adhesion strength of the jig 403 is set lower than that of the film provide with an adhesion surface.

An antenna may be provided to the film provided with an adhesion surface. In the case that the distances of the antenna and the thin film integrated circuit are different from each other, the antenna may be provided to an extensible film and pasted onto the thin film integrated circuit while pulling the film.

As noted above, the process illustrated in FIGS. 8A to 8C is efficiently performed.

Thereafter, a film serving as a protective film (protective film), for example, a Scotch tape, a Tackwell tape (extreme thin single-faced tape), a Double Tack tape (extreme thin double-faced tape), each of which is adhered to an extreme thin film, or the like is delivered from the film delivery roll 413. These films have preferably resistance to an etching gas and high heat resistance. The alignment of adhering is controlled by the alignment device 414, for example, a CCD camera, and the protective film is adhered to the thin film integrated circuit.

Lastly, the completed thin film integrated circuit is taken up by the taken-up roll 412.

Thereafter, the thin film integrated circuit is cut when it is mounted on a good as illustrated in FIGS. 9A to 9C. Accordingly, the thin film integrated circuit in the state of being taken up by the taken-up roll 412 can be transported or traded. As a result, extreme fine thin film integrated circuits of 5 mm square (25 mm$^2$) or less, preferably, 0.3 mm square (0.09 mm$^2$) to 4 mm square (16 mm$^2$) can be readily manufactured, transported, or traded without being dispersed.

An operation evaluation device 209 may be mounted to the manufacturing device explained in this embodiment.

Embodiment 5

In this embodiment, a method for manufacturing a thin film integrated circuit that combines the method for providing a region that is not provided with a release layer (the method for partially forming the release layer) explained in Embodiment 1 and a means for pressing a thin film integrated circuit explained in Embodiment 3 is explained.

Figure 10:
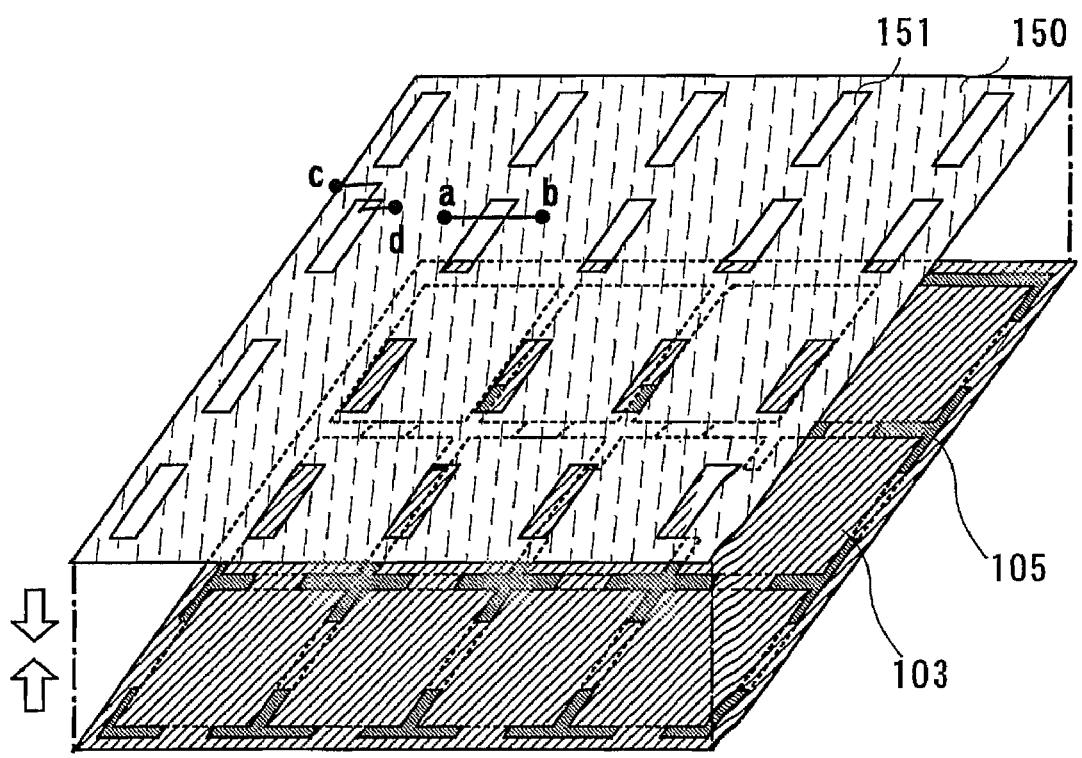
FIG. 10 is a view of illustrating a manufacturing process of a thin film integrated circuit.

As illustrated in FIG. 10, a means for pressing the thin film integrated circuit 150 provided with an opening portion 151 is pasted onto a thin film integrated circuit 101 provided with a region 104 that is not provided with the release layer 102 and a connecting region 106.

Figure 11A:
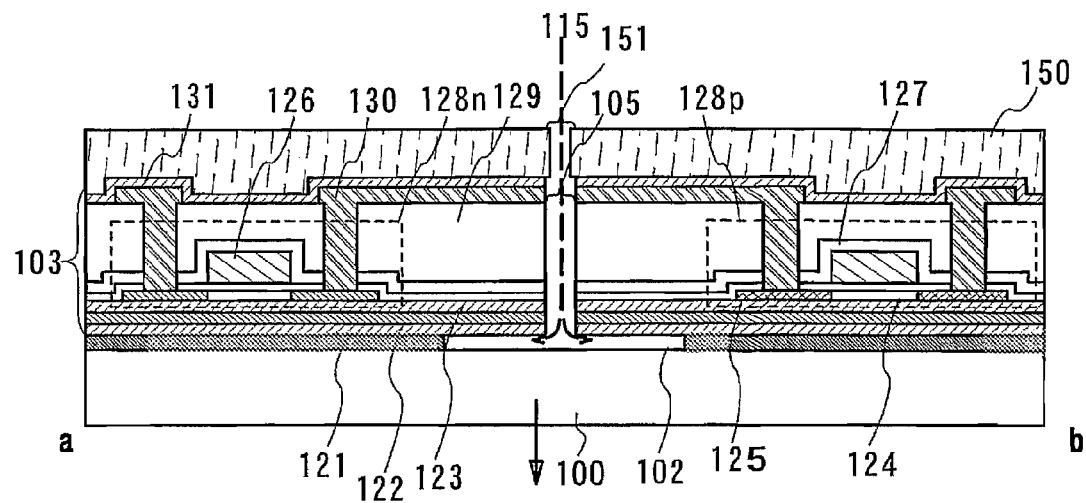
FIGS. 11A and 11B are views of illustrating a manufacturing process of a thin film integrated circuit.
Figure 11B:
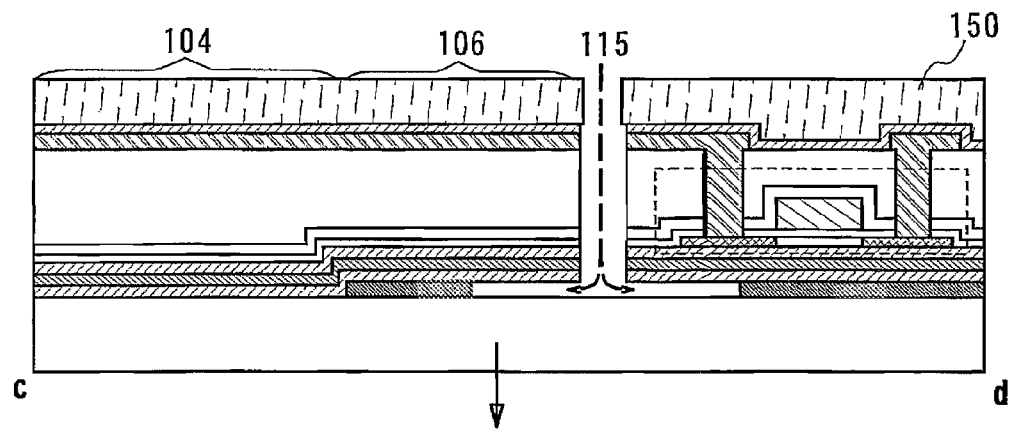

Thereafter, as illustrated in FIGS. 11A and 11B, an etching agent 115 is introduced to the opening portion 151 and the groove 105 to remove the release layer 102. FIG. 11A is a cross-sectional view of FIG. 10 taken along line of a-b, whereas FIG. 11B is a cross-sectional view of FIG. 10 taken along line of c-d.

Then, an insulating substrate 100 is separated in the state that the thin film integrated circuit is not dispersed by the means for pressing the thin film integrated circuit 150. Therefore, the adhesion strength of the adhesive for pasting the means for pressing the thin film integrated circuit 150 is set so as to resist the separation of the insulating substrate 100.

Figure 12A:
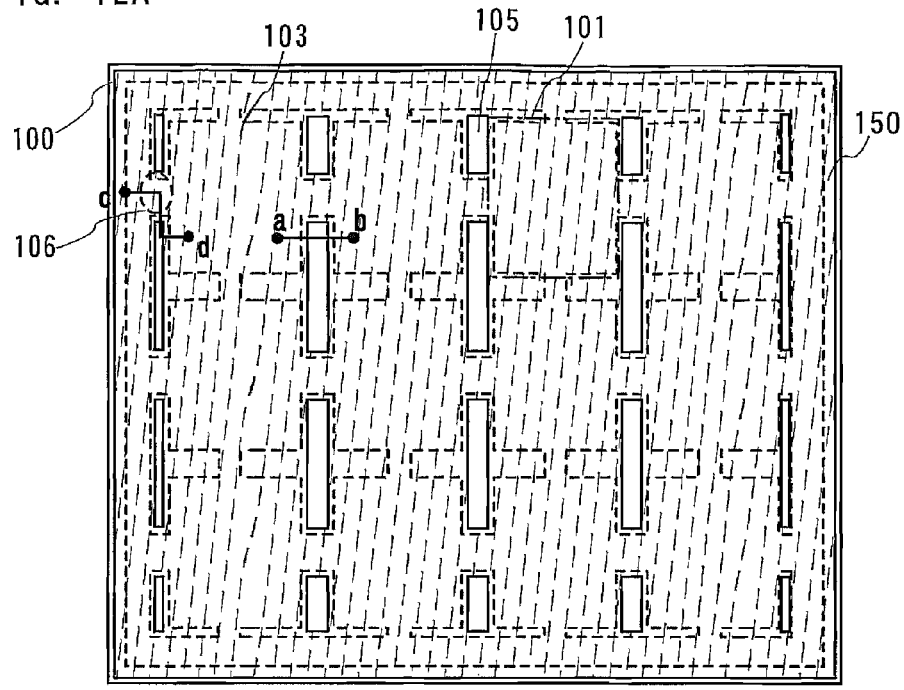
FIGS. 12A to 12C are views of illustrating a manufacturing process of a thin film integrated circuit.
Figure 12B:
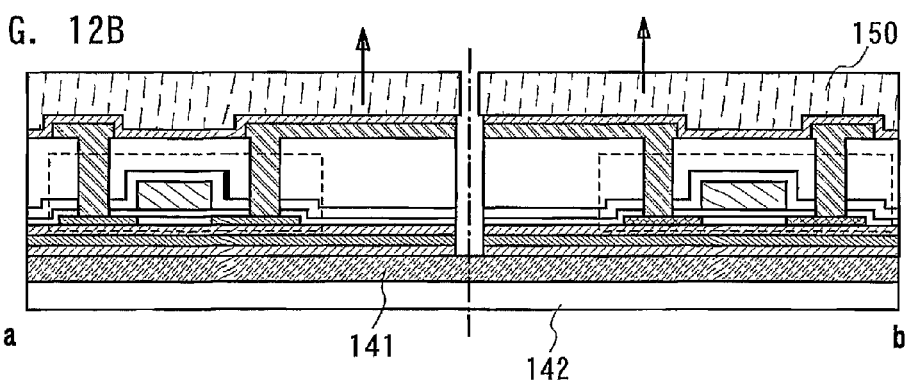
Figure 12C:
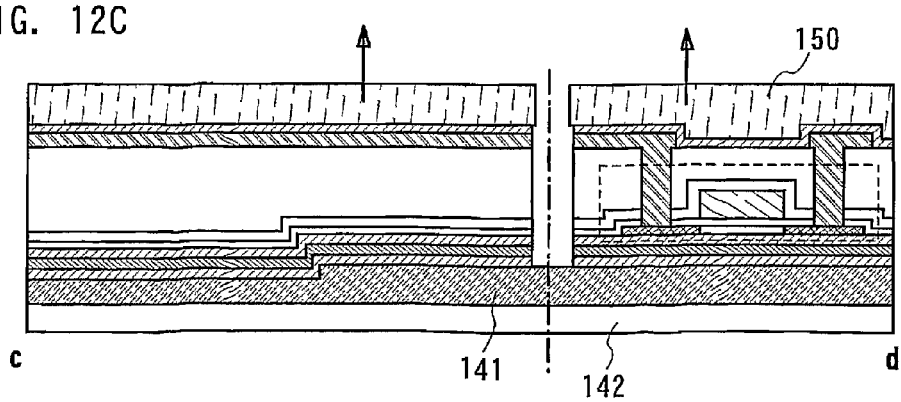

As illustrated in FIGS. 12A to 12C, the thin film integrated circuit is pasted onto another substratum 142 by using adhesive 141. FIG. 12B is a cross-sectional view of FIG. 12A taken along line of a-b, whereas FIG. 12C is a cross-sectional view of FIG. 12A taken along line of c-d.

Thereafter, the means for pressing the thin film integrated circuit 150 is removed. The adhesion strength of the means for pressing the thin film integrated circuit 150 is set lower than that of the adhesive 141.

Then, the thin film integrated circuit 101 is cut by a dicing, scribing, or laser cutting method.

Organic resin such as epoxy resin may be filled to the periphery of the side of the thin film integrated circuits. Accordingly, the thin film integrated circuits can be protected from the outside and becomes in a form capable of being easily portable.

The thin film integrated circuits can be cut into 5 mm square (25 mm$^2$) or less, preferably, 0.3 mm square (0.09 mm$^2$) to 4 mm square (16 mm$^2$).

As noted above, Embodiments 1 to 3 can be freely combined with each other.

Embodiment 6

A method for manufacturing an antenna is explained in this embodiment.

Firstly, the case that an antenna is provided to a substrate for an antenna (antenna substrate) is explained.

Figure 22:
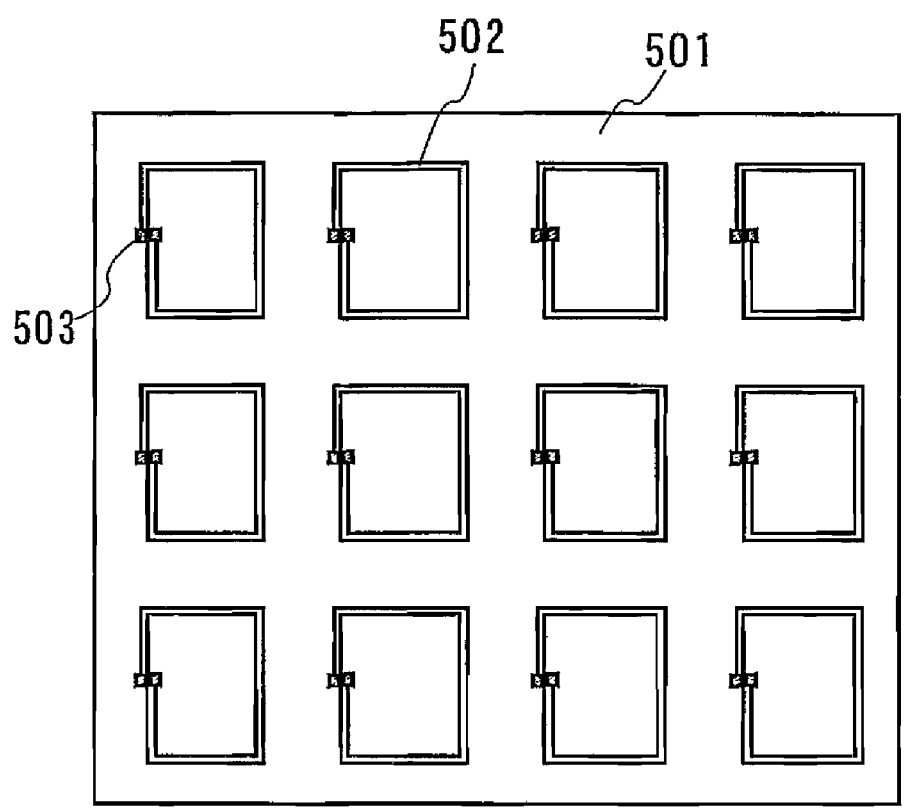
FIG. 22 is a view of illustrating a manufacturing process of an antenna.

As illustrated in FIG. 22, an antenna 502 is formed over an antenna substrate 501. As the antenna substrate 501, a glass substrate such as a barium borosilicate glass or a alumino-borosilicate glass, quartz substrate, or a substrate having flexibility made from acrylic or plastic such as poly ethylene terephthalate (PET), poly ethylene naphthalate (PEN), poly ether sulfone (PES) is preferably used. Since the antenna substrate is preferably thin, a substrate in a film form is preferably used. The case that an antenna coiled in a rectangular shape is formed over the antenna substrate with reference to FIG. 22; however, the shape or length of the antenna is not limited thereto. For example, the antenna may be in a circular or linear shape. Further, the length of the antenna can be selected by communication frequency.

The antenna can be formed by any one of a printing method, a sputtering method, a droplet discharging method, a plating method, a photolithography method, and a vapor deposition method using a metal mask; or a method that combines the foregoing methods. By using the method that combines the foregoing methods, a laminated antenna can be formed by forming a first antenna by the photolithography method or a vapor deposition method and a second antenna by the plating method (electroless plating or electric plating) to cover the first antenna. In the case that the antenna is formed by the droplet method or the printing, the number of manufacturing processes can be reduced since the patterning of a conductive film is not required.

As a material for the antenna, a conductive material such as Ag (silver), Al (aluminum), Au (gold), Cu (copper), Pt (platinum) can be used. In the case that there is fear that any of the foregoing materials has high wiring resistance, the wiring resistance can be reduced by increasing the thickness of the antenna. When an antenna formation area is large, the wiring resistance can be reduced by increasing the width of the antenna. As mentioned above, the wiring resistance may be reduced by forming a laminated antenna and covering the antenna by a material with low resistance. On the other hand, in the case that a conductive material having fear of dispersion despite of having low resistance such as Cu is used, an insulating film is preferably formed to cover the surface to be provided with the antenna and/or the periphery of the Cu.

By a droplet discharging method, the antenna can be formed by dropping Ag mixed into tetradecane as solvent from a nozzle. In this instance, a base film made from titanium oxide (TiOx) may be formed over the antenna substrate to improve adhesiveness of the Ag.

A connecting terminal 503 is preferably provided to the antenna. The antenna can be easily connected to a thin film integrated circuit by the connecting terminal 503. The connecting terminal is not always required to be provided and is not limited to the shape or the arrangement illustrated in FIG. 22.

The flatness of the antenna may be improved by applying pressure to the antenna. As a result, the antenna can be reduced its thickness. In addition to applying pressure, heat can be applied to the antenna. Moreover, a pressuring process and a heating process can be simultaneously carried out. In the case that the antenna is formed by a droplet discharging and a heating process is required to remove solvent, a pressuring process and a heating process are preferably simultaneously carried out.

A groove is provided to the antenna substrate, and the antenna can be formed in the groove. Since the antenna can be formed in the groove, the antenna substrate and the antenna can be reduced their thicknesses.

The antenna can be formed over both sides of the antenna substrate. In this instance, the antenna may be formed over the both sides of the antenna substrate in accordance with the same procedure as mentioned above. As a result, since the length of the antenna can be made longer, communication distance can be extended and communication sensitivity can be improved.

The antenna substrate formed in accordance with the foregoing can be delivered from the film delivery roll 205 illustrated in FIG. 6 or the film delivery roll 411 as illustrated in FIG. 13.

Figure 23:
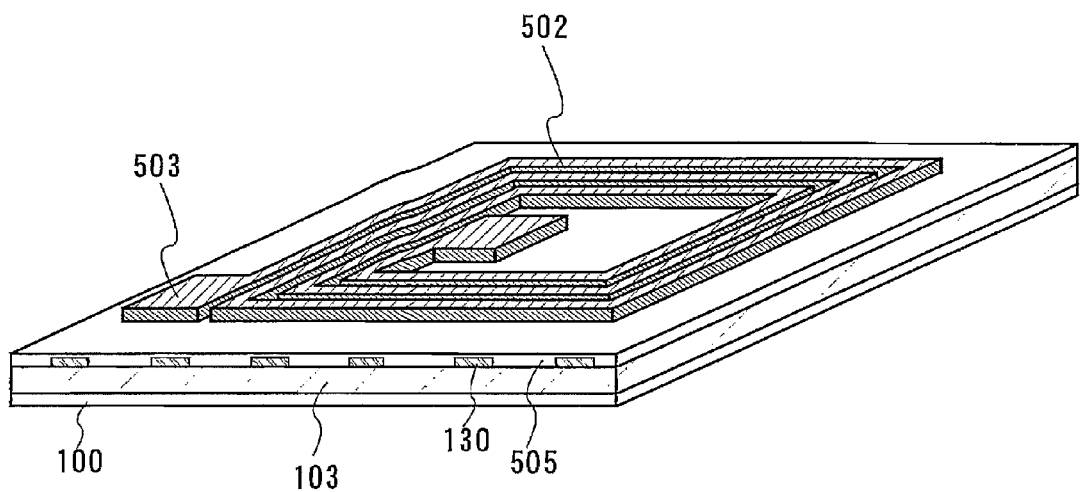
FIG. 23 is a view of illustrating a manufacturing process of an antenna.

The case that the antenna is formed to be integrated with a thin film integrated circuit is explained with reference to FIG. 23. As is the case with the above Embodiments, a TFT layer 103 having a wiring 130 is formed over an insulating substrate 100. Then, an insulating film 505 is formed to cover the wiring 130. The insulating film 505 is formed by a single layered or laminated layered insulating film including oxygen or nitrogen, for example, a silicon oxide (SiOx) film, a silicon nitride (SiNx) film, a silicon oxynitride (SiOxNy) film, a silicon nitride oxide (SiNxOy) film, (x>y)(x, y=1, 2 . . . ), or the like. In the case of using a conductive material that has fear of being dispersed such as Cu as an antenna material, the antenna is preferably formed to have at least an insulating film containing nitrogen. Since most goods mounted with a thin film integrated circuit are touched by hands, the insulating film 505 is preferably formed to have at least an insulating film containing nitrogen.

Thereafter, the antenna 502 is formed. For information on a material of the antenna and a means for manufacturing the antenna, refer to explanation with reference to FIG. 22.

An opening portion is provided to the insulating film 505 to connect the wiring 130 and the antenna 502. At this time, the opening portion may be formed to be located below the connecting terminal 503.

The case that the antenna is formed over the insulating film 505 is explained. However, the antenna 502 and the wiring 130 can be formed by one layer.

By mounting the antenna formed in this way, a non-contact IDF chip and a hybrid IDF chip can be formed.

Embodiment 7

In this embodiment, a good mounted with a thin film integrated circuit is explained.

In order to maintain security, the case that a chip having a thin film integrated circuit is mounted to various kinds of goods is explained. To maintain security can be thought as the prevention of theft and counterfeit.

Figure 16A:
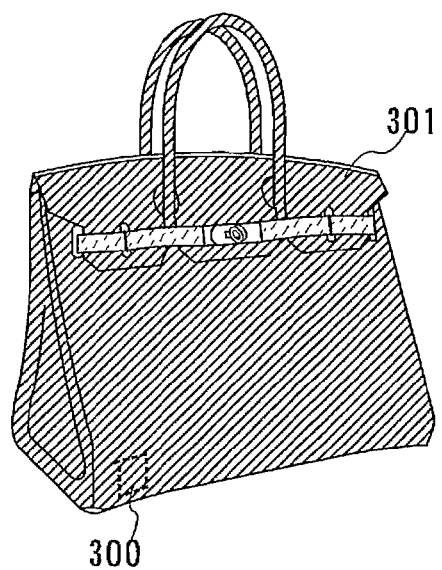
FIGS. 16A and 16B are views of illustrating a using form of a thin film integrated circuit.

As an example of the prevention of theft, the case that a non-contact IDF chip is mounted to a bag is explained. As illustrated in FIG. 16A, a non-contact IDF chip 300 is mounted to a bag 301. For instance, the IDF chip can be mounted to a part of the bottom or the side of the bag or the like. Since the non-contact IDF chip is extremely thin and small, it can be mounted to the bag without detraction from the design of the bag. In addition, since the non-contact IDF is translucent, a thief can hardly identify whether the non-contact IDF chip 300 is mounted or not to the bag. Therefore, the fear of removing the non-contact IDF chip 300 from the bag by the thief is reduced.

Figure 16B:
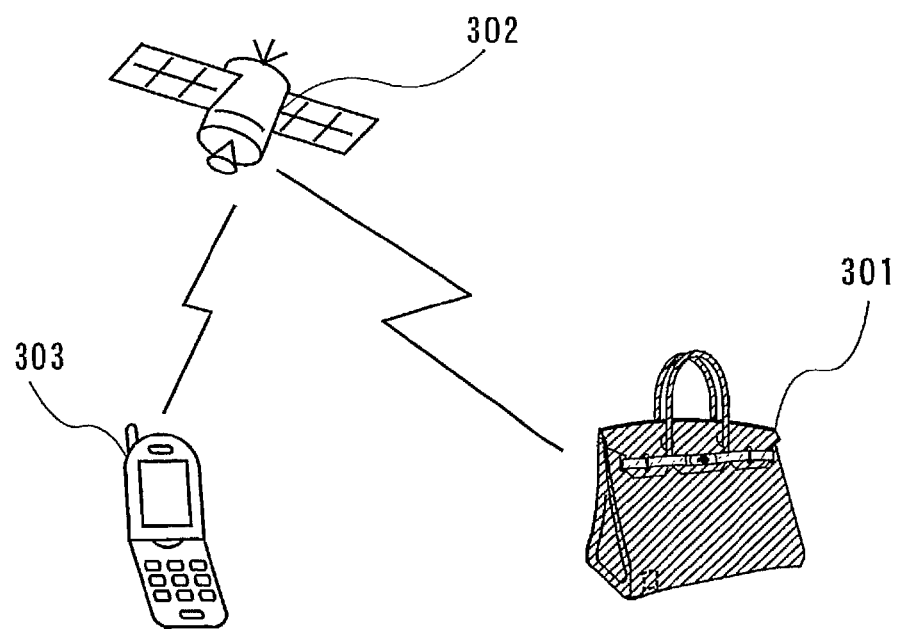

In the case that the bag 301 mounted with the non-contact IDF chip 300 is stolen, information on the actual location of the bag can be obtained by using a GPS (Global Positioning System) as illustrated in FIG. 16B. The GPS is a system that catches a signal sent from a satellite 302, and finds the difference in time, then, positions based on the difference in time. Information from the satellite can be to received by an electronic device such as a cellular phone 303, and the information on the actual location of the bag can be displayed on the cellular phone 303.

In addition to a stolen article, information on actual location of a left property and a lost property can be obtained by the GPS.

In addition to the bag, a vehicle such as a car or bicycle, a watch, or accessories can be mounted with the IDF chip.

As an example of the prevention of counterfeit, the case that an IDF chip is mounted to a passport, driver's license, or the like is explained.

Figure 17A:
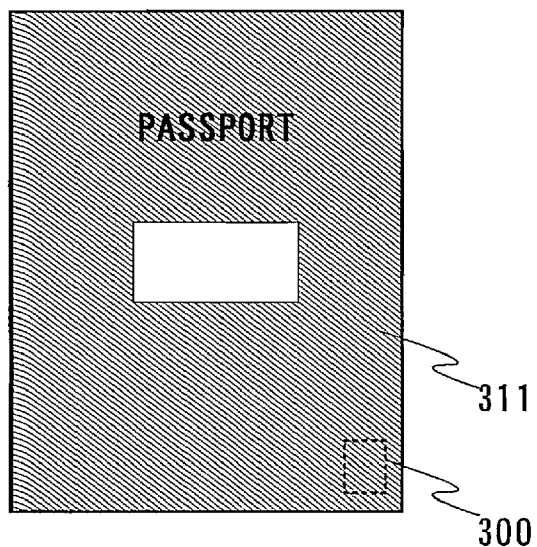
FIGS. 17A and 17B are views of illustrating a using form of a thin film integrated circuit.

FIG. 17A illustrates a passport 311 mounted with the IDF chip 300. In FIG. 17A, the IDF chip 300 is mounted on the cover of the passport; however, the IDF chip 300 can also be mounted to another page. Further, the IDF chip 300 can be mounted to the cover since it is translucent. The IDF chip can be mounted to the inside of the cover by sandwiching between materials such as a cover.

Figure 17B:
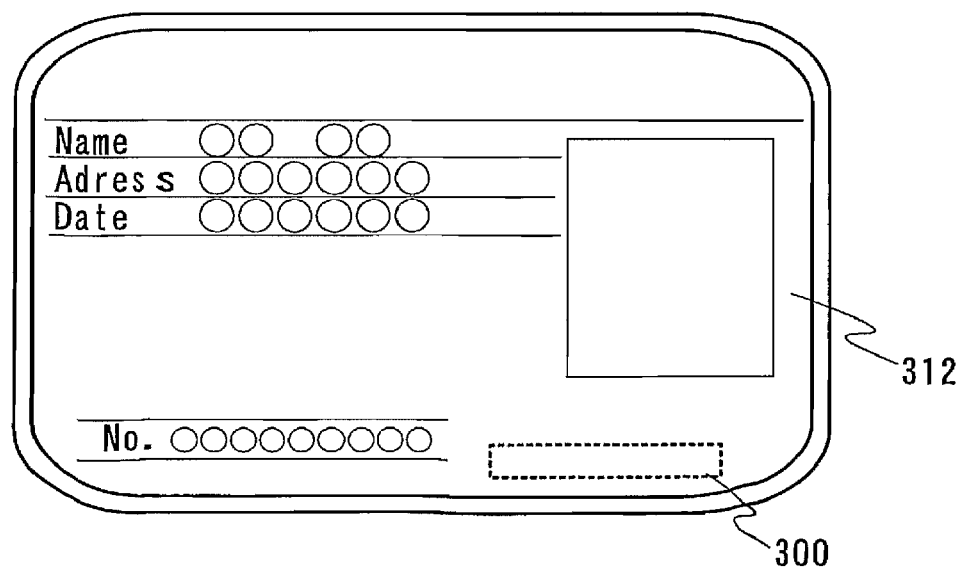

FIG. 17B illustrated a driver's license 312 mounted with the IDF chip 300. In FIG. 17B, the IDF chip 300 is mounted to the inside of the driver's license. Further, the IDF chip 300 can be mounted to the print surface of the driver's license since it is translucent. For example, the IDF chip can be mounted to the print surface of the driver's license and covered by a laminate film. Alternatively, the IDF chip can be sandwiched between a material for forming the driver's license to be mounted to the inside of the driver's license.

By mounting the IDF chip to the foregoing goods, counterfeit can be prevented. Further, counterfeit can also be prevented by mounting the IDF chip to the foregoing bag. In addition, since the IDF chip is extremely thin and small is used, it does not detract from the design of a passport, a driver's license, or the like. Moreover, the IDF chip can be mounted to the surface since it is translucent.

By using the IDF chip, a passport, a driver's license, or the like can be readily controlled. Since information can be stored in the IDF chip without writing the information directly in the passport, the driver's license, or the like; privacy can be protected.

Since the IDF chip is extremely thin and small and has flexibility, it can be mounted to a good in a sheet shape. For example, the case that the IDF chip is mounted to paper money as the good in a sheet shape.

Figure 18:
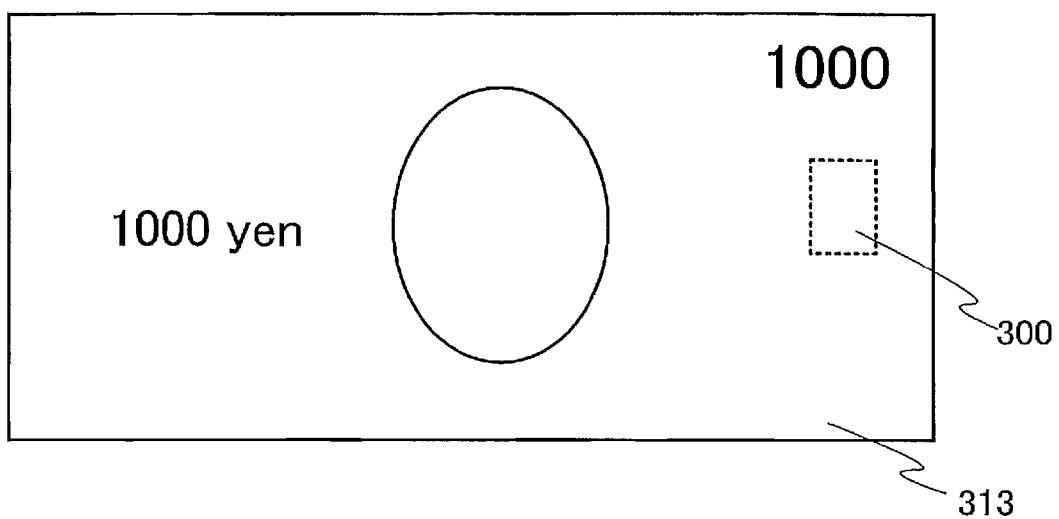
FIG. 18 is a view of illustrating a using form of a thin film integrated circuit.

As illustrated in FIG. 18, the non-contact IDF chip 300 is mounted to paper money 313. FIG. 18 illustrates that the IDF chip is mounted to the inside of the paper money; however, it can be exposed to the surface of the paper money.

The paper money can be printed by using ink containing the IDF chip. Further, the IDF chips can be dispersed into the mixture of chemicals and a material for the paper money to form paper money mounted with a plurality of the IDF chips. Since the IDF chip can be manufactured at low costs, the cost of the paper money is not increased despite of mounting a plurality of the IDF chips to the paper money.

In addition to the paper money, securities, for example, a stock certificate, a check, or coin can be mounted with the IDF chip.

The bending stress of the IDF chip is considered since such the sheet-like good is often bended.

For instance, the state that paper money mounted with the IDF chip is bended in a long axis direction is used for giving explanation. Generally, a sheet-like good tends to bend or is easily bended in a long axis, and so the case that the good is bended in a long axis is used. In the state of bending, a source region, a channel region, and a drain region of a thin film transistor included in the IDF chip 300 are preferably arranged so that the bending direction is perpendicular to the moving direction of carriers. That is, the source region, the channel formation region, and the drain region of the thin film transistor are arranged to be perpendicular to the bending direction. As a result, destruction and peeling due to the bending stress of the thin film transistor can be prevented.

In the case of that a crystalline semiconductor film using laser irradiation is used as illustrated in FIG. 14, laser scanning direction (X axis direction) is preferably perpendicular to the bending direction.

By bending the IDF chip in such the direction, the IDF chip, especially, the thin film transistor is not destroyed, and crystal grain boundary located in the moving direction of carriers can be reduced as much as possible. As a result, an electric property of a thin film transistor, especially, mobility of the thin film transistor can be improved.

By setting the proportion of the area occupied by the patterned semiconductor film in the thin film integrated circuit 1 to 30%, destruction and peeling due to the bending stress of the thin film transistor can be prevented.

Then, the case that the IDF chip is mounted to products such as foods to conduct safe control is explained.

Figure 19:
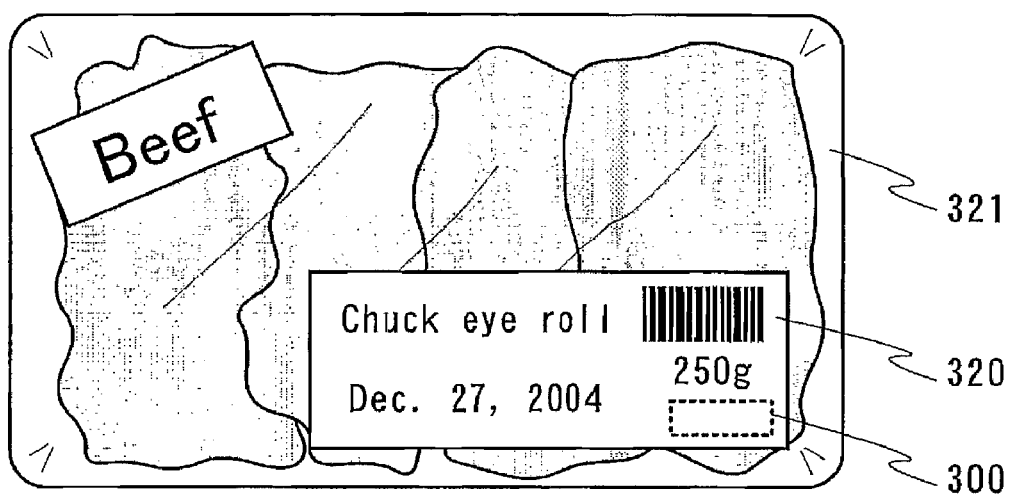
FIG. 19 is a view of illustrating a using form of a thin film integrated circuit.

FIG. 19 illustrates a label 320 mounted with the non-contact IDF chip 300, and a meet pack 321 pasted with the label 320. The IDF chip 300 may be mounted to the surface of the label or the inside of the label. In the case of fresh foods such as vegetables, the IDF chip can be mounted to a plastic food wrap covering the fresh foods.

In the case of mounting the IDF chip to the label, the size of an antenna can be increased. As the increase of the antenna size, the communication distance to a reader can be extended and communication sensitivity can be improved.

Basic information such as a production area, a producer, a processing date, an expiration date, and the like; further, application information such as a recipe using the product can be recorded to the IDF chip. Such the basic information may be recorded by an unwritable memory such as a mask ROM since it is not required to be rewritten. Further, the application information may be recorded by a rewritable and erasable memory such as an EEROM.

To conduct the security control of foods, it is important to know the state of animals or plants before processing. Therefore, the IDF chip may be embedded in the animals or plants to obtain information on the animals or plants by a reader. Information on the animals or plants is a breeding area, a feed, a breeder, presence or absence of infection, and the like.

If the price of the product is recorded in the IDF chip, a product can be further readily and briefly paid compared to the method of using the conventional bar code. For instance, a plurality of products mounted with IDF chips can be paid at once. In the case that a plurality of IDF chips is read, an anti-collision function is required to be mounted to a register that has a function of a reader.

Depending on the communication distance of the IDF chip, paying of a product may be possible even if the distance between the register and the product is long. Further, the IDF chip is useful to prevent shoplifting.

Moreover, the IDF chip can be used in combination with another information medium such as a bar code or a magnetic tape. For instance, basic information that is not required to be rewritten may be recorded to the IDF chip, whereas information that is required to be updated such as a discount price or a bargain price may be recorded on the bar code.

Mounting IDF chip can increase information that can be provided to consumer. Accordingly, consumer can purchase products without anxiety.

Figure 20A:
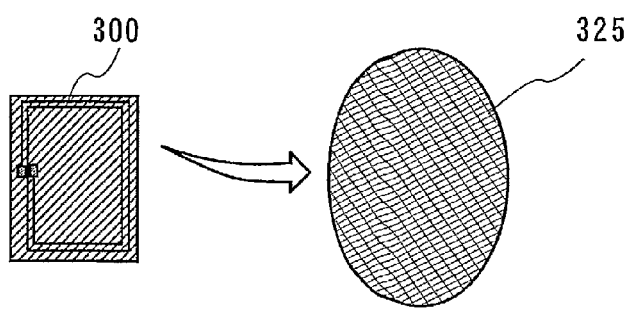
FIGS. 20A and 20B are views of illustrating a using form of a thin film integrated circuit.

To control logistics, the case that the non-contact IDF chip is mounted to a product such as a beer bottle is explained. As illustrated in FIG. 20A, an IDF chip 300 is mounted to a beer bottle 326. For instance, the IDF chip 300 can be mounted by using the label 325. In the case of mounting the IDF chip 300 to the label, the size of an antenna can be increased. As a result, communication distance can be extended, and communication sensitivity can be improved.

Figure 20B:
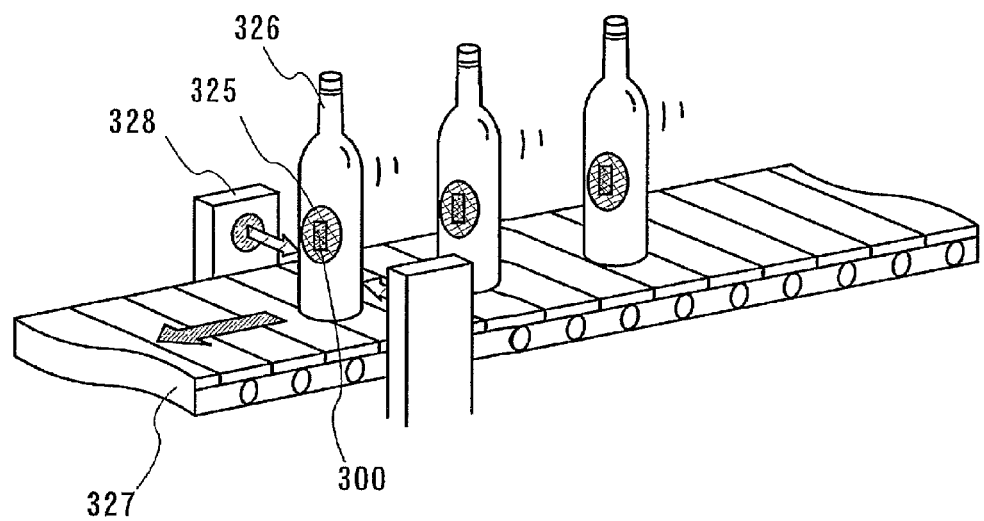

The IDF chip records basic information such as a manufacturing date, a manufacturing area, a using material, and the like. Such the basic information may be recorded by using a memory that is unrewritable such as a mask ROM since the basic information is not required to be rewritten. In addition, the IDF chip records individual information such as a delivery destination, a delivery date, and the like of each beer bottle. For instance, as illustrated in FIG. 20B, each of the delivery destination and the delivery date can be recorded at the time of moving each of the beer bottle along belt conveyor 327 to pass through a writer device 328. Such the individual information may be recorded by a rewritable and erasable memory such as an EEROM.

Since each case is delivered, the IDF chip can be mounted to each of the case or each of a plurality of cases to record individual information.

A system in which a delivery address or a delivery date is calculated by the writer, a personal computer that controls the writer, or the like to be recorded to the IDF chip when information on purchased products is sent to a logistics control center from a delivery destination via a network may be constructed.

A beverage capable of being recorded with a plurality of delivery destinations can reduce the time of inputting by hand, thereby reduced inputting error due to the inputting by hand by means of mounting the IDF chip. In addition, a personnel cost that is the largest cost in a logistics field can be reduced. By mounting the IDF chip, logistics control can be carried out with few errors at low costs.

Application information such as foods to go with beer, a recipe using beer, and the like may be recorded at the delivery destination. As a result, foods and the like can also be advertised to drive buying inclination of a consumer. By mounting the IDF chip in such a way, information that can be provided to a consumer can be increased, and the consumer can purchase products without anxiety.

Then, an article of manufacture mounted with the IDF chip and a manufacturing device (manufacturing robot) controlled based on information of the IDF chip for controlling manufacture are explained.

At present, there are many cases of manufacturing an original product. In this instance, the original products are manufactured by a production line based on original information of the products. For instance, in the production line of the automobiles that can freely select the painting color of a door, the IDF chip is mounted to a part of an automobile and a painting device is controlled based on information from the IDF chip. Automobiles that are painted depending on wishes of a purchaser can be respectively manufactured. As a result of mounting the IDF chip, it is not required to adjust previously the order of injecting automobiles into a production line and the number of the same colored automobiles. In addition, it is not required to set a program for controlling the order and the number of automobiles and the painting device to be along with the order and the number of automobiles. Therefore, the manufacturing device can be individually operated based on information on IDF chip mounted to an automobile.

As noted above, the IDF chip can be used in various places. By information recorded to the IDF chip, specific information on manufacture can be obtained and the manufacturing device can be controlled based on the information.

Figure 21:
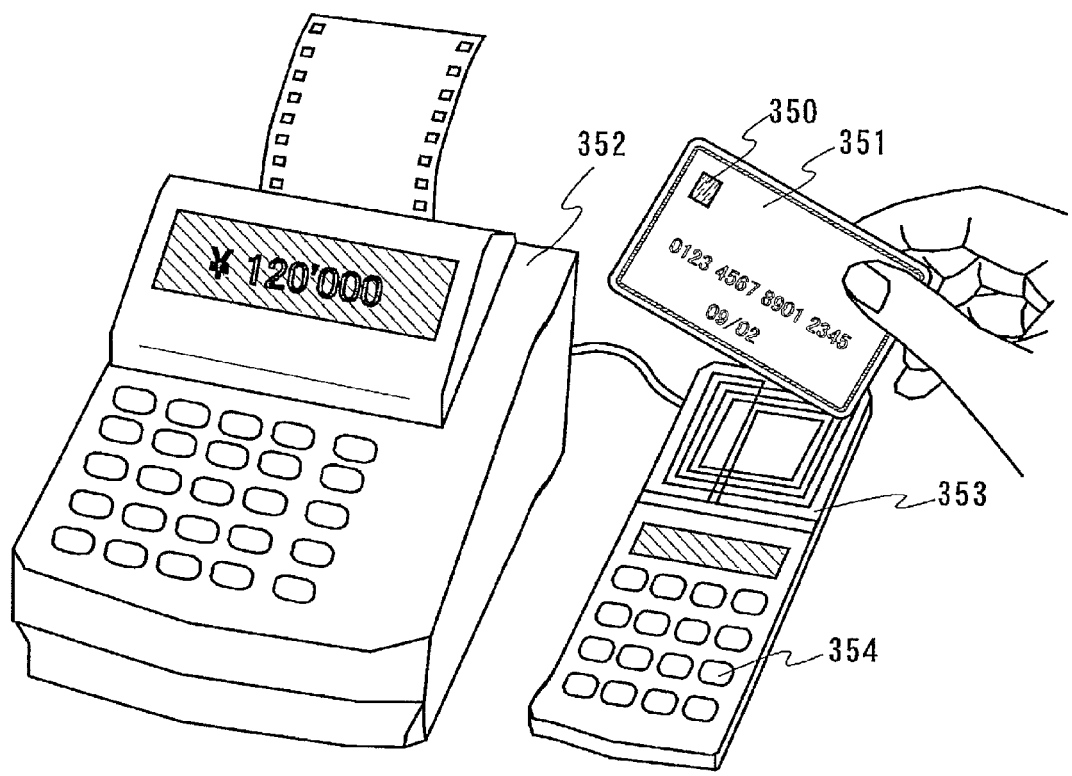
FIG. 21 is a view of illustrating a using form of a thin film integrated circuit.

A mode of using an IC card with a contact IDF chip as electronic money is explained. FIG. 21 illustrates that an account is settled by using a credit card 351. The credit card 351 has a contact IDF chip 350). A register 352 and a reader/writer 353 are arranged. Information on the amount of money credited to an account of the credit card 351 is stored in the IDF chip 350. The reader/wrier 353 can read out information on the amount of money with no contact and transmit the information to the register 352. The register 352 settles an account after confirming that the amount of money credited to the account of the credit card 353 is larger than the account to be settled. Then, information on credit card balance is sent to the reader/writer 353. The reader/writer 353 can write the information on the credit card balance into the IDF chip 350.

Keys 354 capable of inputting a personal identification number may be added to the reader/writer 353 to control the settlement using the credit cart 351 by a third person without permission.

What is claimed is:

1. A method for manufacturing an article comprising:
   selectively forming a release layer over a substrate;
   forming a plurality of thin film integrated circuits over the release layer;
   forming a first opening portion and a second opening portion at a boundary between the thin film integrated circuits adjacent to each other;
   pasting the plurality of thin film integrated circuits to a first substratum;
   removing the release layer so that the plurality of thin film integrated circuits is fixed to the substrate at a region in which the release layer is not formed, with the thin film integrated circuits connected to each other at a connection region between the first opening portion and the second opening portion;
   separating the substrate from the plurality of thin film integrated circuits; and
   transporting the plurality of thin film integrated circuits to a second substratum.

2. The method according to claim 1, wherein the first substratum comprises silicon resin or fluorocarbon resin.

3. The method according to claim 1, wherein the first substratum is a roll having silicon resin or fluorocarbon resin thereon.

4. The method according to claim 1, wherein the second substratum is a flexible substrate or a protective film.

5. The method according to claim 1, wherein an antenna is formed over the second substratum.

6. The method according to claim 1, wherein the plurality of thin film integrated circuits comprises a semiconductor film with a thickness of 0.2 µm or less.

7. A method for manufacturing an article comprising:
   selectively forming a release layer over a substrate;
   forming a plurality of thin film integrated circuits over the release layer;
   exposing the release layer by forming a first opening portion and a second opening portion at a boundary between the thin film integrated circuits adjacent to each other;
   pasting the plurality of thin film integrated circuits to a first substratum having an adhesion surface;
   removing the release layer by introducing an etching agent to the first opening portion and the second opening portion so that the plurality of thin film integrated circuits is fixed to the substrate at a region in which the release layer is not formed, with the thin film integrated circuits connected to each other at a connection region between the first opening portion and the second opening portion;
   separating the substrate from the plurality of thin film integrated circuits; and
   transporting the plurality of thin film integrated circuits to a second substratum having an adhesion surface with a higher adhesion strength than that of the adhesion surface of the first substratum.

8. The method according to claim 7, wherein the first substratum comprises silicon resin or fluorocarbon resin.

9. The method according to claim 7, wherein the first substratum is a roll having silicon resin or fluorocarbon resin thereon.

10. The method according to claim 7, wherein the second substratum is a flexible substrate or a protective film.

11. The method according to claim 7, wherein an antenna is formed over the second substratum.

12. The method according to claim 7, wherein the plurality of thin film integrated circuits comprises a semiconductor film with a thickness of 0.2 µm or less.

13. A method for manufacturing an article comprising:
   selectively forming a release layer over a substrate;
   forming a plurality of thin film integrated circuits over the release layer;

exposing the release layer by forming a first opening portion and a second opening portion at a boundary between the thin film integrated circuits adjacent to each other;

pasting the plurality of thin film integrated circuits to a first substratum having an adhesion surface;

removing the release layer by introducing an etching agent to the first opening portion and the second opening portion;

separating the substrate from the plurality of thin film integrated circuits; and transporting the plurality of thin film integrated circuits to a second substratum having an adhesion surface with a higher adhesion strength than that of the adhesion surface of the first substratum, wherein the substrate comprises a first region on which the release layer is formed and a second region on which the release layer is not formed, wherein the plurality of thin film integrated circuits is fixed to the substrate in the second region, and wherein the thin film integrated circuits are connected to each other at a connection region between the first opening portion and the second opening portion.

14. The method according to claim 13, wherein the first substratum comprises silicon resin or fluorocarbon resin.

15. The method according to claim 13, wherein the first substratum is a roll having silicon resin or fluorocarbon resin thereon.

16. The method according to claim 13, wherein the second substratum is a flexible substrate or a protective film.

17. The method according to claim 13, wherein an antenna is formed over the second substratum.

18. The method according to claim 13, wherein the plurality of thin film integrated circuits comprises a semiconductor film with a thickness of 0.2 µm or less.

19. The method according to claim 7, wherein the etching agent comprises gas including halogen fluoride.

20. The method according to claim 13, wherein the etching agent comprises gas including halogen fluoride.

21. A method for manufacturing an article comprising:

selectively forming a release layer over a substrate;

forming a plurality of thin film integrated circuits over the release layer;

forming a first opening portion and a second opening portion at a boundary between the thin film integrated circuits adjacent to each other; and removing the release layer so that the plurality of thin film integrated circuits is fixed to the substrate at a region in which the release layer is not formed, with the thin film integrated circuits connected to each other at a connection region between the first opening portion and the second opening portion.

22. The method according to claim 21, wherein the plurality of thin film integrated circuits comprises a semiconductor film with a thickness of 0.2 µm or less.

* * * * *

UNITED STATES PATENT AND TRADEMARK OFFICE
CERTIFICATE OF CORRECTION

| | | |
|---|---|---|
| PATENT NO. | : 8,058,152 B2 | Page 1 of 1 |
| APPLICATION NO. | : 12/859878 | |
| DATED | : November 15, 2011 | |
| INVENTOR(S) | : Takuya Tsurume et al. | |

It is certified that error appears in the above-identified patent and that said Letters Patent is hereby corrected as shown below:

IN THE SPECIFICATIONS:

At column 4, line 47, "fainting" should be --forming--;

At column 5, line 10, "102;" should be --102,--;

At column 7, line 42, "fowled" should be --formed--;

At column 8, line 51, "polyimide, acrylic, polyimide" should be --polyimide, acrylic, polyamide--;

At column 13, line 14, "92 times" should be --9.2 times--;

At column 14, line 45, "FIG-4C" should be -- FIG. 4C--;

At column 20, line 44, "can be to received" should be --can be received--;

At column 23, line 53, "350)" should be --350--.

Signed and Sealed this
Third Day of January, 2012

David J. Kappos
*Director of the United States Patent and Trademark Office*